(12) United States Patent
Zhang et al.

(10) Patent No.: US 11,506,804 B2
(45) Date of Patent: Nov. 22, 2022

(54) INVERSE STRATIGRAPHIC MODELING USING A HYBRID LINEAR AND NONLINEAR ALGORITHM

(71) Applicant: Saudi Arabian Oil Company, Dhahran (SA)

(72) Inventors: Ming Zhang, Beijing (CN); Mokhles Mustapha Mezghani, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 833 days.

(21) Appl. No.: 15/994,586

(22) Filed: May 31, 2018

(65) Prior Publication Data

US 2019/0369278 A1   Dec. 5, 2019

(51) Int. Cl.
*G01V 1/28* (2006.01)
*G06F 17/12* (2006.01)

(52) U.S. Cl.
CPC .............. *G01V 1/282* (2013.01); *G06F 17/12* (2013.01); *G01V 2210/66* (2013.01)

(58) Field of Classification Search
CPC ..... G06F 17/12; G01V 1/282; G01V 2210/66
USPC .......................................................... 703/10
See application file for complete search history.

(56) References Cited

U.S. PATENT DOCUMENTS

| 4,783,751 A | 11/1988 | Ehrlich |
| 4,868,883 A | 9/1989 | Chen |
| 6,205,402 B1 | 3/2001 | Lazaar et al. |
| 6,246,963 B1 | 6/2001 | Cross et al. |
| 6,754,588 B2 | 6/2004 | Cross et al. |
| 7,424,367 B2* | 9/2008 | Saltzer ................... G01V 1/306 702/14 |
| 8,583,410 B2 | 11/2013 | Sisk et al. |
| 9,372,943 B2* | 6/2016 | Li .......................... G06T 17/05 |
| 9,626,771 B2 | 4/2017 | Mezghani et al. |
| 2007/0133866 A1 | 6/2007 | Chang et al. |

(Continued)

OTHER PUBLICATIONS

Duan, Taizhong. "Similarity measure of sedimentary successions and its application in inverse stratigraphic modeling", Jul. 24, 2017, Pet. Sci. 14, pp. 484-492. (Year: 2017).*

(Continued)

*Primary Examiner* — Andre Pierre Louis
(74) *Attorney, Agent, or Firm* — Fish & Richardson P.C.

(57) ABSTRACT

In a first step, a defined scope value is selected for each of a plurality of hydrodynamic input parameters. A simulated topographical result is generated using the selected scope values and a forward model. A detailed seismic interpretation is generated to represent specific seismic features or observed topography. A calculated a misfit value representing a distance between the simulated topographical result and a detailed seismic interpretation is minimized. An estimated optimized sand ratio and optimized hydrodynamic input parameters are generated. In a second step, a genetic algorithm is used to determine a proportion of each grain size in the estimated optimized sand ratio. A misfit value is used that is calculated from thickness and porosity data extracted from well data and a simulation result generated by the forward model to generate optimized components of different grain sizes. Optimized hydrodynamic input parameters and optimized components of different grain sizes are generated.

20 Claims, 22 Drawing Sheets

(56) References Cited

U.S. PATENT DOCUMENTS

| | | |
|---|---|---|
| 2008/0187219 A1 | 8/2008 | Chen et al. |
| 2009/0164186 A1* | 6/2009 | Haase ............... G01V 99/00 703/10 |
| 2009/0204377 A1* | 8/2009 | Van Wagoner ........ G01V 1/282 703/9 |
| 2011/0295580 A1 | 12/2011 | Sisk |
| 2015/0127261 A1 | 5/2015 | Aldea et al. |
| 2015/0234863 A1 | 8/2015 | Lilje |
| 2015/0293257 A1 | 10/2015 | Liebich et al. |
| 2016/0343150 A1 | 11/2016 | Mezghani et al. |
| 2017/0097958 A1 | 3/2017 | Mezghani et al. |

OTHER PUBLICATIONS

Rijks et al. "Attribute extraction: an important application in any detailed 3-D interpretation study" Sep. 1991, Geophysics: The Leading Edge of Exploration, pp. 11-19. (Year: 1991).*

Bornholdt et al. "Inverse Stratigraphic Modeling Using Genetic Algorithms", 1999, Numerical Experiments in Stratigraphy: Recent Advances in Stratigraphic and Sedimentologic Computer Simulations, SEPM Special Publications No. 62, pp. 85-90. (Year: 1999).*

Duan et al., "Similarity measure of sedimentary successions and its application in inverse stratigraphic modeling", Petroleum Science, China University of Petroleum (Beijing), Heidelberg, vol. 14, No. 3, Jul. 24, 2017 (Jul. 24, 2017), pp. 484-492, 9 pages.

Hussain et al., "Moving Models into Reality: An Automated Workflow to Calibrate Forward Strati graphic Modeling; Application to Hani fa and Arab-D in Central Saudi Arabia", SPE-188920-MS, Abu Dhabi International Petroleum Exhibition & Conference, Jan. 1, 2017,11 pages.

International Search Report and Written Opinion issued in International Application No. PCT/US2019/032489 dated Aug. 19, 2019, 17 pages.

International Search Report and Written Opinion issued in International Application No. PCT/US2019/024755 dated Jul. 12, 2019, 12 pages.

Dey, "Fluvial Hydrodynamics," GeoPlanet: Earth and Planetary Science, 2014, 706 pages.

Hoogendoom et al., "Storms: Process-response modelling of fluvio-deltaic stratigraphy," Computers and Geosciences vol. 34, Issue 10, Oct. 2008, 23 pages.

Kubo et al., "Advance and application of the stratigraphic simulation model 2D-SedFlux: From tank experiment to geological scale simulation," Sedimentary Geology, vol. 178, Issues 3-4, Jul. 15, 2005 9 pages.

GCC Examination Report in GCC Appln. No. GC 2019-37381, dated May 22, 2020, 4 pages.

International Search Report and Written Opinion issued in International Application No. PCT/US2016/029748 dated Aug. 5, 2016, 16 pages.

Al-Bazzaz and Al-Mehanna, "Porosity, Permeability, MHR Calculations Using SEM and Thin-section Images for Characterizing Complex Mauddud-Burgan Carbonate Reservoir," Paper SPE-110730-MS presented at the Asia Pacific Oil and Gas Conference and Exhibition, Oct. 30-Nov. 1, 2007, 10 pages.

Asmussen et al., "Semi-automatic Segmentation of Petrographic This Section Images using a "Seeded-Region Growing Algorithm" with an Application to Characterize Wheathered Subarkose Sandstone," Computers & Geosciences, vol. 83, Issue C, Oct. 2015, 11 pages.

Barraud, "The use of watershed segmentation and GIS software for textural analysis of thin sections," Journal of Volcanology and Geothermal Research, vol. 154, Jun. 1, 2006, 17 pages.

Bartozzi et al., "Automated Grain Boundary Detection and Classification in Orientation Contrast Images," Journal of Structural Geology, Copyright 2000, pp. 1569-1579.

Benedet et al., "A morphological modeling study to compare different methods of wave climate schematization and evaluate strategies to reduce erosion losses from a beach nourishment project," Coastal Engineering, vol. 112, Jun. 2016, 18 pages.

Benedet et al., "Optimization of nearshore dredge pit design to reduce impacts on adjacent beaches," Journal of Coastal Research vol. 29, Issue 3, May 2013, 8 pages.

Bennetzen et al., "Automatic High-Throughput Detection of Fluid Inclusions in Thin-Section Images using a Novel Algorithm," Paper IPTC-17680 presented at the International Petroleum Technology Conference, Jan. 19-22, 2014, 11 pages.

Berrezueta et al. "Qualitative and quantitative changes in detrital reservoir rocks caused by $CO_2$—brine—rock interations during first injection phases (Utrillas sanstones, northern Spain)," Solid Earth vol. 7, Jan. 2016, 17 pages.

Blair and Berryman, "Estimation of Permeability and Relative Permeability for Sandstone using Image Analysis of Cross Sections" Rock Mechanics as a Multidisciplinary Science, Roegiers (ed.), Mar. 1991, 12 pages.

Bornholdt et al., "Experiments in Stratigraphy: Recent Advances in Stratigraphic and Sedimentologic Computer Simulators—Inverse stratigraphic modeling using genetic algorithms," SEPM Publication, Society of Sedimentary Geology, No. 62, Jan. 1, 1999, 6 pages.

Brown and Davies, "Methods for medium-term prediction of the net sediment transport by waves and currents in complex coastal regions," Continental Shelf Research, vol. 29, Jun. 2009, 13 pages.

Buscombe, "Estimation of Grain-Size Distributions and Associated Parameters from Digital Images of Sediment," Sedimentary Geology, Copyright 2008, pp. 1-10.

Cantrell et al., "New tools and approaches in carbonate reservoir quality prediction: a case history from the Shu'aiba Formation, Saudi Arabia," The Geological Society of London, Special Publications, Sep. 29, 2014, 25 pages.

Cazanacli et al., "Deltaic Network Growth and Stratigraphy through a Rule Based Geometric Model," AAPG 2015, Annual Convention and Exhibition, May 31-Jun. 3, 2015, 48 pages.

Chatzirodou et al., "Investigation of deep sea shelf sandbank dynamics driven by highly energetic tidal flows," Marine Geology, vol. 380, Oct. 1, 2016, 19 pages.

Choh and Milliken, "Virtual Carbonate Thin Section using PDF: New Method for Interactive Visualization and Archiving," Carbonates and Evaporites, vol. 19, No. 2, Dec. 2004, 6 pages.

Choudhury et al., "Automated Grain Boundary Detection by CASRG," Journal of Structural Geology, Mar. 1, 2006, vol. 28, No. 3, pp. 363-375.

Cross and Lessenger, "Construction and application of a stratigraphic inverse model," SEPM Special Publications, vol. 62, Jan. 1, 1999, 15 pages.

Das, "Morphology-Based Image Processing, In: Guide to Signals and Patterns in Image Processing: Foundations," Methods and Applications, Springer, Apr. 23, 2015, pp. 269-298, Abstract only, 3 pages.

De Bruin and Bouanga, "Time attributes of Stratigraphic Surfaces, analyzed in the structural and Wheeler transformed domain," EAGE 69th Conference and Exhibition, Jun. 11-14, 2007, 5 pages.

DeVasto et al., "Using image Analysis and Arcgis to Improve Automatic Grain Boundary Detection and Quantify Geological Images," Computers and Geosciences, vol. 49, Dec. 2012, 8 pages.

Francus, "An Image-Analysis Technique to Measure Grain-Size Variation in Thin Sections of Soft Clastic Sediments," Sedimentary Geology 121, Nov. 1998, 10 pages.

Fueten, "A Computer-Controlled Rotating Polarizer Stage for the Petrographic Microscope," Computers & Geosciences, vol. 23, No. 2, Mar. 1, 1997, pp. 203-208.

Goins and Reedy, "Digital Image Analysis in Microscopy for Objects and Architectural Conservation," Objects Specialty Group Postprints, vol. 7, Jun. 12, 2000, 16 pages.

Goodchild and Fueten, "Edge Detection in Petrographic Images Using the Rotating Polarizer Stage," Computers and Geosciences, vol. 24, No. 8, Oct. 1998, 7 pages.

Goodchild, "Geological Image Processing of Petrographic Thin Sections using the Rotating Polarizer Stage," A thesis submitted to the Department of Earth Sciences in partial fulfillment of the requirements for the degree of Master of Science, Brock University, St. Catharines, Ontario, Sep. 1998, 166 pages.

(56) References Cited

OTHER PUBLICATIONS

Graham et al., "Automated Sizing of Coarse-Grained Sediments: Image-Processing Procedures," Mathematical Geology, vol. 37, Issue 1, Jan. 2005, 28 pages.

Granjeon and Joseph, "Concepts and applications of a 3D multiple lithology, diffusive model in stratigraphic modeling," Numerical Experiments in Stratigraphy: Recent Advances in Stratigraphic and Sedimentological Computer Simulations, vol. 62, SEPM Special Publication, Jan. 1999, 15 pages.

Granjeon, "Modelisation stratigraphique deterministe: conception et applications d'un modele diffusif 3D multilithologique," Doctoral Thesis, Universit of Rennes 1, 1996, 216 pages.

Griffiths et al., "Sedsim in hydrocarbon exploration," Geologic Modeling and Simulation, Kluwer Academic, Jan. 2001, 27 pages.

Grove and Jerram, "jPOR: An ImageJ Macro to Quantify Total Optical Porosity From Blue-Stained Thin Sections," Computers & Geosciences, vol. 37, Nov. 2011, 10 pages.

Heilbronner, "Automatic Grain Boundary Detection and Grain Size Analysis Using Polarization Micrographs or Orientation Images," Journal of Structural Geology, Copyright 2000, pp. 969-981.

Hoogendoorn, "The impact of changes in sediment supply and sea-level on fluvio-deltaic stratigraphy," PhD,, Dissertation, Delft University of Technology, Jan. 31, 2006, 176 pages.

Hossain, "Relative Permeability Prediction from Image Analysis of Thin Sections," Paper SPE-143606, presented at the SPE EUROPEC/EAGE Annual Conference and Exhibition, May 23-26, 2011, 10 pages.

opendtect.org' [online], "Open Seismic Repository," available on or before Dec. 7, 2017, [retrieved on Jun. 11, 2018], retrieved from URL: <http://opendtect.org/osr/>, 2 pages.

Huang et al., "Numerical forward modelling of 'fluxoturbidite' flume experiments using SEDSIM," Marine and Petroleum Geology vol. 35, Aug. 2012, 11 pages.

Huang et al., "Recent development in stratigraphic forward modelling and its application in petroleum exploration," Australian Journal of Earth Sciences, vol. 62, Issue 8, Jan. 2016, 18 pages.

Hutton and Syvitski, "Advances in the numerical modeling of sediment failure during the development of a continental margin," Marine Geology, vol. 203, Issue 3-4, Jan. 2004, 14 pages.

Hutton and Syvitski, "Sedflux 2.0: An advanced process-response model that generates three-dimensional stratigraphy," Computerand Geoscience vol. 34, Issue 10, Oct. 2008, 19 pages.

Igleias et al., "Automatic recognition of hematite grains under polarized reflected light microscopy through image analysis," Minerals Engineering, Pergamon Press: Oxford, GB, vol. 24, No. 12, Apr. 12, 2011, pp. 1264-1270.

Izadi et al., "An intelligent system for mineral identification in thin sections based on a cascade approach," Computers and Geoscience, vol. 99, Feb. 2017, 13 pages.

Kendall et al., "The simulation of the sedimentary fill of basins," Journal of Geophysical Research, vol. 96, No. B4, Apr. 10, 1991, 19 pages.

Kubo et al., "Inverse modeling of post Last Glacial Maximum transgressive sedimentation using 2D-SedFlux: Application to the northern Adriatic Sea," Marine Geology, vol. 234, Issues 1-4, Dec. 18, 2006, 11 pages.

Kursun, "Particle Size and Shape Characteristics of Kemerburgaz Quartz Sands Obtained by Sieving, Laser Diffraction, and Digital Image Processing Methods," Mineral Processing and Extractive Metallurgy Review, vol. 30, Issue 4, Oct. 2009, 2 pages, Abstract only.

Laigle et al., "A workflow integrating seismic interpretation and stratigraphic modelling-application to the NPRA Basin," EAGE Research Workshop: From Seismic Interpretation to Stratigraphic and Basin Modelling—Present and Future, Grenoble, Sep. 2006, 6 pages.

Layman, "Porosity Characterization Utilizing Petrographic Image Analysis: Implications for Identifying and Ranking Reservoir Flow Units, Happy Spraberry Field, Garza County, Texas," Thesis Submitted to the Office of Graduate Studies of Texas A&M University in partial fulfillment of the requirements of the degree of Master of Science, May 2002, 114 pages.

Lerche, "An inverse method for determining parameters for folded structures," Quarterly of applied mathematics, vol. 54, Dec. 1996, 11 pages.

Li et al., "GIS-based detection of grain boundaries," Journal of Structural Geology, Pergamon Press, vol. 30, No. 4, Dec. 27, 2007, pp. 431-443.

Liang et al., "A reduced-complexity model for river delta formation—Part 1: Modeling deltas with channel dynamics," Earth Surface Dynamics vol. 3, Jan. 28, 2015, 20 pages.

Liang et al., "A reduced-complexity model for river delta formation—Part 2: Assessment of the flow routing scheme," Earth Surface Dynamics, vol. 3, Jan. 28, 2015, 18 pages.

Lorenzo-Trueba et al., "A geometric model for the dynamics of a fluvially dominated deltaic system under base-level change," Computers and Geosciences vol. 53, Apr. 2013, 9 pages.

MacQueen, "Some Methods for classification and Analysis of Multivariate Observations," proceedings of 5th Berkeley Symposium on Mathematical Statistics and Probability, vol. 1, Jun. 21-Jul. 18, 1965, published by Berkeley, California, University of California Press, 1967, 17 pages.

Marschallinger and Hofmann, "The Application of Object Based Image Analysis to Petrographic Micrographs," Microscopy: Science, Technology, Applications and Education, A. Mendez-Vilas and J. Diaz (Eds.), FORMATEX, Dec. 2010, 7 pages.

Morehead et al., "Modeling the temporal variability in the flux of sediment from ungauged river basins," Global and Planetary Change, vol. 39, Issues 1-2, Oct. 2003, 16 pages.

Nicolas et al., "Forward Stratigraphic Modelling, Deterministic Approach to Improve Carbonate Heterogeneity Prediction; Lower Cretaceous, Abu Dhabi," International Petroleum Exhibition and Conference, Nov. 9-12, 2015, 16 pages.

Nordlund, "Formalizing geological knowledge with an example of modeling stratigraphy using fuzzy logic," Journal of Sedimentary Research vol. 66, Issue 4, Jul. 1, 1996, 10 pages.

Nordlund, "FUZZIM: forward stratigraphic modeling made simple," Computers and Geosciences, vol. 25, Issue 4, May 1999, 8 pages.

Obara et al., "Utilisation of the Image Analysis Method for the Detection of the Morphological Anisotropy of Calcite Grains in Marble," Computer Geoscience, Copyright 2007, 7 pages.

Obara, "An Image Processing Algorithm for the Reversed Transformation of Rotated Microscope Images," Computers & Geosciences, Copyright 2007, pp. 853-859.

Overeem et al., "Three-dimensional numerical modeling of deltas," SEPM Special Issue, vol. 83, River Deltas: concepts, models and examples, Jan. 2005, 19 pages.

Perring et al., "Using Automated Digital Image Analysis to Provide Quantitative Petrographic Data on Olivine-Phyric Basalts," Computers & Geosciences, vol. 30, Mar. 2004, 13 pages.

Pirmez et al., "Clinoform development by advection-diffusion of suspended sediment: Modeling and comparsionto natural systems," Journal of Geophysical Research, vol. 103, Issue 24, Oct. 10, 1998, 18 pages.

Qayyum et al., "A modem approach to build 3D sequence stratigraphic framework," Oil and Gas Journal vol. 111, Oct. 2013, 16 pages.

Rafidah et al., "A review of stratigraphic simulation techniques and their applications in sequence stratigraphy and basin analysis," Bulletin of the Geological Society of Malaysia, vol. 54, Nov. 2008, 11 pages.

Reedy and Kamboj, "Image Analysis Protocol Instructions #1: Spatial Calibration of Images, Project Report," University of Delaware, Laboratory of Analysis of Cultural Materials, 2004, 9 pages.

Reedy et al., "Image Analysis in Quantitative Particle Studies of Archaeological Ceramic Thin Sections," Advances in Archaeological Practice, vol. 2, No. 4, Nov. 2014, 17 pages.

Reedy, "Review of Digital Image Analysis of Petrographic Thin Sections in Conservation Research," Journal of the American institute for Conservation, vol. 45, Issue 2, Jun. 2006, 8 pages.

(56) References Cited

OTHER PUBLICATIONS

Richa et al., "Image Analysis and Pattern Recognition for Porosity Estimation from Thin Sections," SEG Technical Program Expanded Abstracts, Jan. 2006, 5 pages.
Ritchie et al., "Three-dimensional numerical modeling of deltaic depositional sequences 1: Influence of the rate and magnitude of sea-level change," Journal of Sedimentary Research, vol. 74, Issue 2, Mar. 1, 2004, 18 pages.
Ritchie et al., "Three-dimensional numerical modeling of deltaic depositional sequences 2: Influence of the rate and magnitude of sea-level change," Journal of Sedimentary Research, vol. 74, Issue 2, Mar. 1, 2004, 18 pages.
Rostami et al., "Developing a Committee Machine Model for Predicting Reservoir Porosity from Image Analysis of Thin Sections," proceedings of the 20th Formation Evaluation Symposium of Japan, Oct. 1-2, 2014, 11 pages.
Ruzyla, "Characterization of Pore Space by Quantitative Image Analysis," SPE Formation Evaluation, Aug. 1986, 10 pages.
Seybold et al., "Modeling river delta formation," proceeding of the National Academy of the United States of America, vol. 104, Issue 43, Oct. 23, 2007, 6 pages.
Sharma and Sharma, "Image Segmentation Using Morphological Operation for Automatic Region Growing," International Journal of Innovative Research in Computer and Communication Engineering, vol. 2, Issue 9, Sep. 2014, 7 pages.
Sharma, "Quantitative stratigraphic inversion," Dissertation for degree of Doctor of Philosophy in Geosciences, Virginia Polytechnic Institute and State University, Dec. 6, 2006, 105 pages.
Slupik, et al., "The stratigraphy of the Neogene-Quaternary succession in the southwest Netherlands from the Schelphoek borehole (42G4-11/42G0022)—a sequence-stratigraphic approach. Netherlands," Journal of Geosciences vol. 86, Issue 4, Dec. 2007, 16 pages.
Smith and Beermann, "Image Analysis of Plagioclase Crystals in Rock Thin Sections using Grey Level Homogeneity Recognition of Discrete Areas," Computers & Geosciences 33, Mar. 2007, 22 pages.
Starkey et al., "A Microcomputer-Based System for Quantitative Petrographic Analysis," Computers & Geosciences, vol. 20, No. 9, Copyright 1994, pp. 1285-1296.
Šťastná et al., "Cathodoluminescence Microscopy and Petrographic Image Analysis of Aggregates in Concrete Pavements Affected by Alkali-Silica Reaction," Materials Characterization, vol. 65, Mar. 2012, 11 pages.
Syvitski and Hutton, "2D SEDFLUX 1.0C: an advanced process-response numerical model for the fill of marine sedimentary basins," Computer and Geosciences vol. 27, Issue 6, Jul. 2001, 23 pages.
Syvitski and Hutton, "Failure of Marine Deposits and their Redistribution by Sediment Gravity Flows," Pure and Applied Geophysics, vol. 160, Issue 10-11, Oct. 2003, 17 pages.
Syvitski et al., "HydroTrend: a climate-driven hydrological transport model for predicting discharge and sediment to lakes or ocean," Computer Geoscience, vol. 24, Issue 1, Jan. 29, 1998, 18 pages.
Tarquini et al., "A Microscopic Information System (MIS) for Petrographic Analysis," Computers and Geosciences, vol. 36, No. 5, May 1, 2010, pp. 665-674.
Tetzlaff, "Input uncertainty and conditioning in siliciclastic process modelling, Geological Prior Information: Informing Science and Engineering," Geological Society, London, Special Publications, vol. 239, Jan. 2004, 15 pages.
Wardaya et al., "Integrating Digital Image Processing and Artificial Neural Network for Estimating Porosity from Thin Section," Paper IPTC-16959, presented at the International Petroleum Technology Conference, Mar. 26-28, 2013, 10 pages.
Weltje et al., "Stratigraphic inversion of siliciclastic basin fills: a note on the distinction between supply signals resulting from tectonic and climatic forcing," Basin Research, vol. 10, Jun. 28, 1998, 25 pages.
Wijns et al., "Interactive inverse methodology applied to stratigraphic forward modelling," Geological Prior Information: Informing Science and Engineering, Geological Society, London, Special Publications vol. 239, 2004, 9 pages.
Wijns et al., "Inverse modelling in geology by interactive evolutionary computation," Journal of Structural Geology, vol. 25, Jan. 9, 2003, 11 pages.
Zhou et al., "Segmentation of Petrographic Images by Integrating Edge Detection and Region Growing," Computers & Geosciences, Copyright 2004, pp. 817-831.
GCC Examination Report in GCC Appln. No. GC 2019-37665, dated May 10, 2021, 4 pages.

* cited by examiner

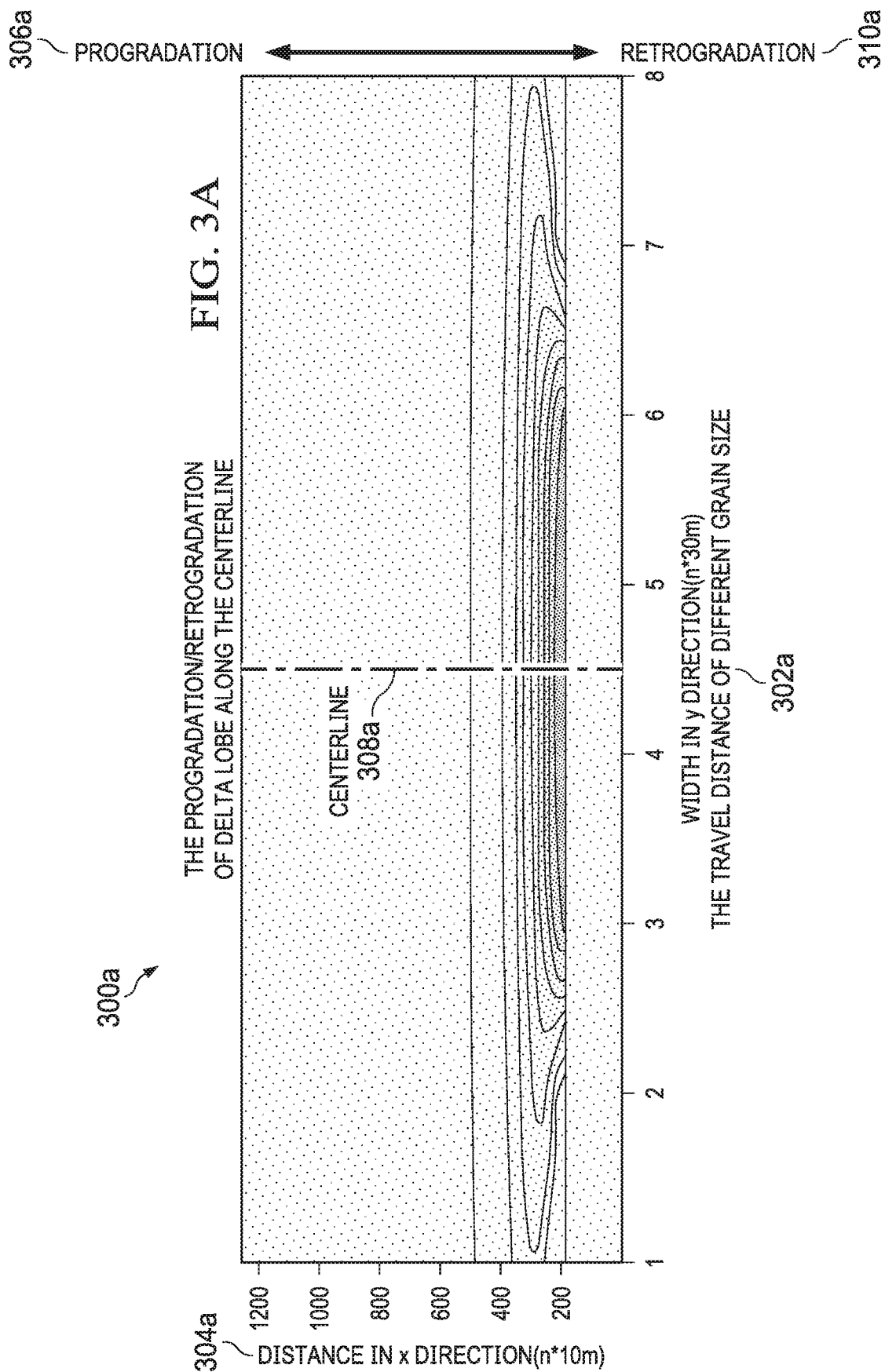

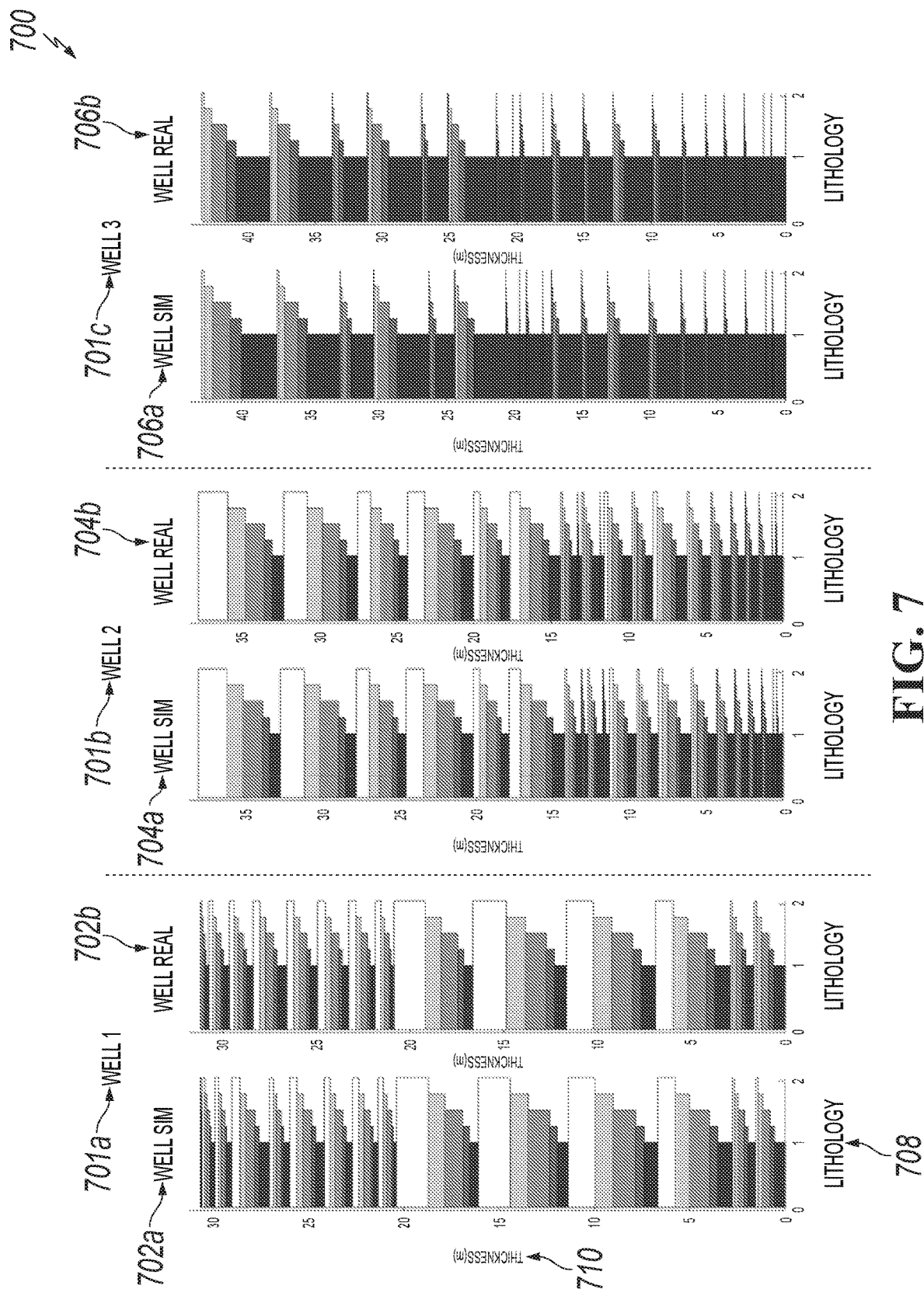

INVERSE STRATIGRAPHIC MODELING USING A HYBRID LINEAR AND NONLINEAR ALGORITHM

BACKGROUND

A forward stratigraphic model is a digital representation of detailed internal geometry and rock properties of a subsurface earth volume, such as a petroleum reservoir or a sediment-filled basin, and is used as a tool to investigate formation of stratigraphic or sedimentary geologic layers on geological timescales. Forward stratigraphic models provide geologic reservoir simulations used, for example, to select locations for new hydrocarbon wells, estimate hydrocarbon reserves, and plan hydrocarbon-reservoir-development strategies. Three essential prerequisites are needed to consider stratigraphic forward simulation to be successful. First, a stratigraphic formation process recorded by outcrop, seismic, or other hard data must be well understood. Second, a forward model must be able to describe a stratigraphic process-response system. Third, an accurate estimation of many input parameters must be made. However, satisfying all three prerequisites has proven to be technically challenging.

SUMMARY

The present disclosure describes inverse stratigraphic modeling using a hybrid linear and nonlinear algorithm.

In an implementation, in a first step, a defined scope value is selected for each of a plurality of hydrodynamic input parameters. A simulated topographical result is generated using the selected scope values and a forward model. A detailed seismic interpretation is generated to represent specific seismic features or observed topography. A calculated a misfit value representing a distance between the simulated topographical result and a detailed seismic interpretation is minimized. An estimated optimized sand ratio and optimized hydrodynamic input parameters are generated. In a second step, a genetic algorithm is used to determine a proportion of each grain size in the estimated optimized sand ratio. A misfit value is used that is calculated from thickness and porosity data extracted from well data and a simulation result generated by the forward model to generate optimized components of different grain sizes. Optimized hydrodynamic input parameters and optimized components of different grain sizes are generated.

Implementations of the described subject matter, including the previously described implementation, can be implemented using a computer-implemented method; a non-transitory, computer-readable medium storing computer-readable instructions to perform the computer-implemented method; and a computer-implemented system comprising one or more computer memory devices interoperably coupled with one or more computers and having tangible, non-transitory, machine-readable media storing instructions that, when executed by the one or more computers, perform the computer-implemented method/the computer-readable instructions stored on the non-transitory, computer-readable medium.

The subject matter described in this specification can be implemented so as to realize one or more of the following advantages. First, estimating and tuning values of the many required input parameters necessary for a successful forward stratigraphic model is a typically a manual process performed by geological engineers. The manual estimation and tuning can be very time consuming and results are often inconsistent between different geological engineers. However, the described methodology permits an automatic solution for calibrating a forward stratigraphic model with multiscale prior observation data (for example, well data (from well logs and well cores) and seismic data), which is more accurate and consistent than conventional methods of generating forward stratigraphic models. Second, the generated forward stratigraphic models can be used to improve overall accuracy of geological predictions. Third, the described methodology can be used by a real-time computing system to dynamically control, or direct control of, tangible equipment based on generated output data, such as a forward stratigraphic model. Fourth, the described methodology is less expensive from a computational standpoint and can improve the operation of a computer, at least in reducing computational requirements to generate a forward stratigraphic model.

The details of one or more implementations of the subject matter of this specification are set forth in the Detailed Description, the Claims, and the accompanying drawings. Other features, aspects, and advantages of the subject matter will become apparent to those of ordinary skill in the art from the Detailed Description, the Claims, and the accompanying drawings.

DESCRIPTION OF DRAWINGS

FIG. 3A is a data plot illustrating development of delta lobe along a centerline, according to an implementation of the present disclosure.

FIG. 7 are graphs illustrating a comparison between simulated well data and real (observed) well data, according to an implementation of the present disclosure.

Like reference numbers and designations in the various drawings indicate like elements.

DETAILED DESCRIPTION

Figure 1:
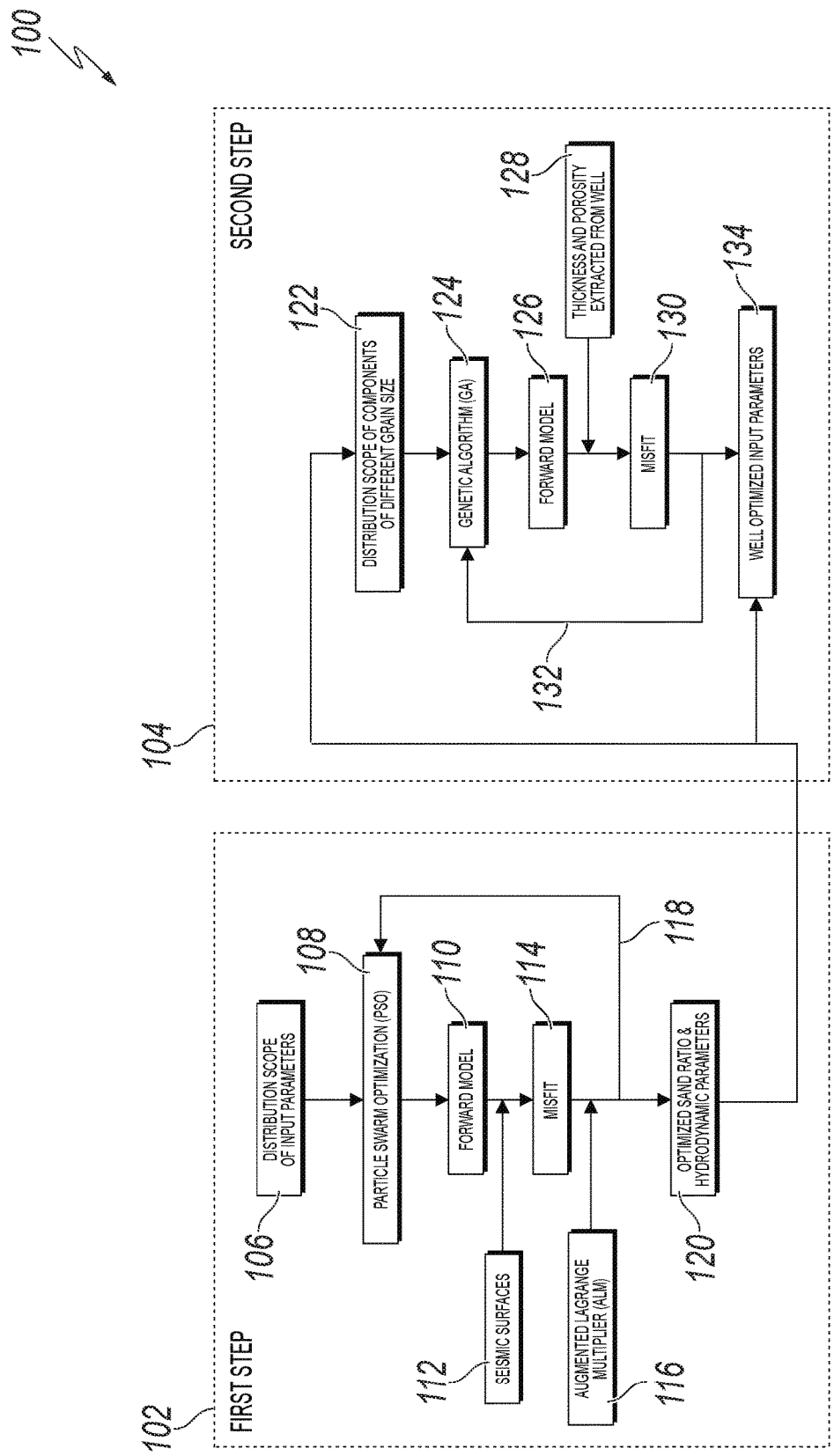
FIG. 1 is a flowchart illustrating an example of a computer-implemented method for inverse stratigraphic modeling using a hybrid linear and nonlinear algorithm, according to an implementation of the present disclosure.

The following detailed description describes inverse stratigraphic modeling using a hybrid linear and nonlinear algorithm, and is presented to enable any person skilled in the art to make and use the disclosed subject matter in the context of one or more particular implementations. Various modifications, alterations, and permutations of the disclosed implementations can be made and will be readily apparent to those of ordinary skill in the art, and the general principles defined can be applied to other implementations and applications, without departing from the scope of the present disclosure. In some instances, one or more technical details that are unnecessary to obtain an understanding of the described subject matter and that are within the skill of one of ordinary skill in the art may be omitted so as to not obscure one or more described implementations. The present disclosure is not intended to be limited to the described or illustrated implementations, but to be accorded the widest scope consistent with the described principles and features.

A forward model (for example, a two-dimensional (2D) hydrodynamic forward model designed for a fluvial-dominated delta system forward simulation) is a digital representation of detailed internal geometry and rock properties of a subsurface earth volume, such as a petroleum reservoir or a sediment-filled basin. Forward models are used as forward engines for stratigraphic forward simulations. For example, calculations can be performed on a particular forward model to investigate/simulate formation of stratigraphic or sedimentary geologic layers on geological timescales and to provide geologic reservoir simulations for selection of locations for new hydrocarbon wells, estimation of hydrocarbon reserves, and planning hydrocarbon-reservoir-development strategies.

Stratigraphic forward models can be divided into four main sub-categories: 1) geometrical; 2) fuzzy logic; 3) diffusion; and 4) hydrodynamic process-response. The geometrical model describes geometric results of a depositional process from geological aspect rather than the physical process itself. The fuzzy logic model controls spatial and temporal distribution of sediments through a series of logical rules. Diffusion models assume that transportation and deposition of sediment could be described by diffusion processes with certain diffusion gradients on a pre-existing sediment mass/surface. The hydrodynamic process-response model follows fundamental hydrodynamic laws and can numerically model different types of depositional system processes.

Three prerequisites are typically needed to consider stratigraphic forward simulation to be successful. First, a stratigraphic formation process recorded by outcrop, seismic, or other hard data must be well understood. Second, a forward model must be able to describe a stratigraphic process-response system. Third, an accurate estimation of many input parameter values must be made. However, satisfying all three prerequisites has proven to be technically challenging, particularly the accurate estimation of the many input parameter values.

In some implementations, an example of a standard input file that can be used with the described methodology can include the following input parameters. Note that the input file includes particular input parameters for the described inversion algorithm (that is, the Particle Swarm Optimization (PSO) and Genetic algorithm (GA) sections):

```
################################################################
# Input parameters list of 2D Delta Inverse Stratigraphic modeling #
# (Deterministic) #
################################################################
# This input parameters list contains two parts, including forward model
# parameters and inverse model parameters.
#-----------------------------------------------------------------
# Forward model parameters
#-----------------------------------------------------------
TIME
# Simulation time definitions (required)
# Start time [years]     End time [years]     Sampling interval [years]
        4000                 2000                       100
#-----------------------------------------------------------
GRID
# Grid size definitions and geometry (required)
# Grid interval
# Step length in X [m]     Step length in Y [m]
        10                         30
```

-continued

```
# Min of X [m]    Max of X [m]    Min of Y [m]    Max of Y [m]
       1            12500            -500            10000
#------------------------------------------------------------
SEDIMENT
# Sediment Parameters (required)
# Grain size number
5
# Diameter of each grain size [mm]
# pebble 4-64 mm, granule 2-4 mm, vcse 1-2 mm, cse 0.5-1 mm, med 0.25-0.5 mm,
# fn 0.125-0.25, vfn 0.062-0.125 mm, slt 0.0039-0.062 mm, clay < 0.0039 mm
#     Vcse      med       fn      slt      clay
       1.2       0.3      0.15    0.06     0.005
#------------------------------------------------------------
SOURCE
# Location of deposit
# Polar 1        Temperate 2        Mediterranean\Tropical 3
1
# Regional maximum elevation
2000
# Average temperature (Fahrenheit)
-4.4
# River width       River depth
    100                  5
# Initial guess of Discharge range
# Modern river discharge database may be employed as reference for estimation
# <database Web address>
# Minimum of Discharge [m^3/s]        Maximum of X [m^3/s]
           100                                500
#------------------------------------------------------------
SEA_LEVEL
# Define sea level curve (required)
# Sea level curve file
/home/user/<user>/Stochastic_model/Input_file/Sea_level.txt
#------------------------------------------------------------
TOPOGRAPHY
# Define topography (required)
# Topography file
/home/user/<user>/Stochastic_model/Input_file/Topography.txt
#------------------------------------------------------------
OUTPUT_WELL
# Number of wells
3
# Well locations in meters (optional)
# X
300
500
700
# Output well data file name
Delta2DsimWell.txt
#------------------------------------------------------------
#------------------------------------------------------------
#------------------------------------------------------------
# Inverse model parameters
#------------------------------------------------------------
SEISMIC_SURFACE
# Seismic interpreted surface will be treated as geomorphology
# constrain (required)
# Geomorphology file
/home/user/<user>/Stochastic_model/Input_file/
Seismic_surface.txt
#------------------------------------------------------------
PSO
# PSO algorithm for geomorphology optimization (required)
# Threshold of geomorphology constrain 0.99        0.8
#------------------------------------------------------------
INPUT_WELL
# Input well data will be used as constrain for inverse (required)
# Well data file
/home/user/<user>/Stochastic_model/Input_file/Well_data_noise.txt
#------------------------------------------------------------
GA
# Genetic algorithm for well data optimization (required)
# Error tolerence
0.05
# Num of Generation        Num of seeds in each generation
         3                              15
# Cross Rate       Mutation Rate
     0.5                0.03
#------------------------------------------------------------
```

```
#-------------------------------------------------------------------------------
#-------------------------------------------------------------------------------
# Output_file
#------------------------------------------------------------
OUTPUT_FILE
# Output file location and file name
# Output file location
/home/user/<user>/Stochastic_model/Output_file/
# Output file name Thickness
Delta2DsimT.txt
# Output file name Fraction
Delta2DsimF.txt
# Output file name Porosity
Delta2DsimP.txt
# Output file name Topography
Delta2DsimTop.txt
#------------------------------------------------------------
# *** End of example input file ***
```

Accurately estimating and tuning the values of the many required input parameters necessary for a successful forward stratigraphic model is typically a manual process performed by geological engineers. However, the manual estimation and tuning can be very time consuming and results are often inconsistent between different geological engineers.

Several semi-automated or automated inverse-type workflows have been proposed by previous researchers to solve the accurate estimation issue. Most of the prior attempts can be summarized as follows: 1) estimated/random initial values are input into a forward model to generate simulation results; 2) both simulation output and observations are used to build an objective function(s) for misfit calculation; and 3) a misfit (for example, a thickness difference of sandstone) produced from a comparison of output and real data is fed into an inverse algorithm for input parameter optimization. In prior efforts, for example: 1) thickness of facies tracts extracted from well data and well cores were utilized to build an objective function for use as an inverse engine; 2) used lithology for misfit calculation and a GA for inverse optimizations; 3) employed subjective values provided by an expert user to build an objective function(s) and utilized a genetic algorithm(s) to rank output models; 4) Multi-Dimensional Scaling (MDS) and Self-Organizing Maps (SOM) were introduced to visualize multi-dimensional parameters; and 5) topography and age-calculation of misfit were used with a neighborhood algorithm(s) for optimization with a suggestion that piecewise inversion performs better than a one-step inversion.

Prior efforts had a common attribute—forward models were treated as a black box with many inputs during an iterative process, even though the iteration process was expensive with respect to time. An inverse algorithm (that is, a global optimization algorithm) was designed to operate the buttons automatically based on a sensitivity analysis until a satisfied output was reached. A benefit of the prior efforts is the inverse algorithm is very versatile because it is an individual module that does not rely on any specific forward model. A disadvantage of the prior efforts is that the effectiveness and efficiency of the inverse algorithm can be limited by a forward model. For example, since the forward model is treated as a black box, a piecewise inversion is difficult to perform in each step of a forward simulation. As a result, the leveraged inverse algorithm can only provide generally-optimized parameters based on the overall result of the forward simulation. The generally-optimized parameters are normally a poor fit for each time step associated with the forward simulation. As a result, the forward simulation is expensive with respect to time, and the information provided by the forward simulation is not be fully usable. Variations of multiple input parameter values require consideration of many possible combinations. Since the forward model can be exercised multiple times in each iteration based on the possible input parameter value combinations, it is often necessary to artificially constrain the number of iterations, which limits inversion accuracy.

At a high-level, the current disclosure describes calibrating a forward model with multiscale prior observation data (for example, well data and seismic data), which is more accurate and consistent than conventional methods of generating input parameter values. The generated forward model can be used to improve overall accuracy of geological predictions.

At a lower-level, the described methodology improves upon building an objective function for calculation of a misfit and optimizing input parameters using the calculated misfit and an inverse algorithm. A deltaic-type system is used, as formation processes for delta deposits have been well-studied and mathematically described by diffusion models, simplified models, and hydrodynamic process-response models with different fluid motion equations (for example, momentum, advection-diffusion, and stochastic parcel-based cellular routing). In an implementation of the described methodology, an advection-diffusion equation is utilized as a forward engine. PSO, an Augmented Lagrange Multiplier (ALM) and a GA are also employed to build a two-step inverse algorithm. An interpreted seismic surface, lithology thickness, and porosity extracted from well-logs are utilized for objective function establishment.

The described two-step inverse algorithm is used for input parameter optimization of a forward model designed for clastic deposits to quickly estimate some of the fundamental input parameters (for example, discharge, velocity, and components of different grain sizes) needed to conduct a detailed and full physical forward simulation. Clastic deposits are composed of clasts (fragments) of pre-existing minerals and rock. A clast can be considered to a fragment of geological detritus, such as chunks and smaller grains of rock broken off other rocks by physical weathering. Clastic is used with reference to sedimentary rocks and particles in sediment transport, whether in a suspension or as bed load, and in sediment deposits. In some implementations, the forward model is a 2D forward model designed for a fluvial-dominated delta system simulation. The kernel engine of the forward model can be a steady-state 2D advection-diffusion equation in-plane and a linear model in the vertical direction, while compaction is considered. The two-step inverse algorithm is designed based on forward model characteristics.

In the first step of the inverse algorithm, topography (geomorphological information) is used to build an objective function for a sand ratio and other parameter optimization (for example, hydrodynamic parameters) in each time-step of a forward simulation. In some implementations, PSO and ALM are the engines of the piecewise inversion in the first step. For example, a global optimization algorithm (for example, PSO) is used to initialize a group of random particles to calculate a distribution of different grain sizes by solving a 2D advection-diffusion equation or other nonlinear equation. A linear optimization algorithm (for example, ALM) is then executed to solve components of each grain size and calculate misfits of topography produced from simulation and real data. PSO or another global optimization algorithm is applied to update particles (that is, input parameters) and to search for an optimal solution according to the calculated misfits. When an optimal solution is found, different grain sizes are classified as sand and mud, and their components are added, respectively, to generate a sand ratio. Components of different grain sizes are calculated through linear optimization and other parameters are estimated through global optimization.

In the second step of the inverse algorithm, which generates a final optimization, thickness of different grain sizes and porosity (for example, extracted from well logs and well cores) is used to build an objective function for calibrating components of different grain sizes under a constraint of the sand ratio estimated from the first step. A GA or another global algorithm is used as a kernel engine. Correlation and residual error or other criterion are used to rank a similarity between simulation and observation.

Three notable features distinguish the described methodology when compared to previous attempts:

1. Instead of treating the forward model as a black box, the forward model had been partly rewritten as a convex function in the first step, permitting convex function optimization in the first step. A non-linear algorithm was utilized to optimize hydrodynamic parameters involved in a 2D advection-diffusion in-plane. A quadratic optimization of a linear model was performed to determine components of different grain sizes, which control a vertical stacking pattern. The non-linear algorithm significantly improves the inversion efficiency and can be used on other forward models driven by hybrid linear and nonlinear algorithms.
2. Input parameters are optimized hierarchically rather than in a one-step optimization. Compared to other parameters, different grain size components are more sensitive to high-frequency details rather than low-frequency trends of the forward model. Therefore, different grain size components calculated (for example, using ALM) were reduced dimensionally by calculating a sand ratio in the first step of the inversion. The one-dimensional sand ratio is used to approximate an influence of high-dimensional grain size components on topography, which is the low-frequency trend of forward model. This dimension reduction process can be considered a smoothing of a cost function under a prior geological constraint. The objective function is converted from a non-convex function to convex function for an accurate and stable solution. Different grain size components are optimized by using well data in the second step of inversion under the constraint of the sand ratio calculated in the first step of the inversion. The hierarchical/cascading inversion strategy reduces dimensions of parameters in each step, reduces the number of iterations needed, processing requirements, and increases solution stability.
3. The application of a piecewise inversion, results in the most fit parameters for each simulation step when compared to conventional approaches. Cumulative error is minimized and accuracy improved. Computation cost is also reduced since an optimization can be performed in each step rather than waiting until an entire forward model has been processed.

FIG. 1 is a flowchart illustrating an example of a computer-implemented method 100 for inverse stratigraphic modeling using a hybrid linear and nonlinear algorithm, according to an implementation of the present disclosure. For clarity of presentation, the description that follows generally describes method 100 in the context of the other figures in this description. However, it will be understood that method 100 can be performed, for example, by any system, environment, software, and hardware, or a combination of systems, environments, software, and hardware, as appropriate. In some implementations, various steps of method 100 can be run in parallel, in combination, in loops, or in any order.

At a high-level, method 100 contains a forward model and a two-step inverse engine. The two-step inverse engine leverages an inverse algorithm to output a set of well-optimized parameters for subsequent forward modeling.

Seismic data is utilized in the first step (102) of the two-step inverse algorithm to catch a low-frequency trends (that is, topography of a delta deposit). Hydrodynamic input parameters (for example, discharge and velocity), and a sand ratio are optimized.

Well data obtained from penetrating the delta deposit are employed in the second step (104) of the two-step inverse algorithm to calibrate high-frequency input parameters (for example, porosity and reservoir thickness) of the delta deposit. Components of different grain sizes are optimized.

In some implementations, the resultant, well optimized input parameters can be used with a forward simulation generate an additional result.

Forward Model

A 2D hydrodynamic forward model is used simulate progradation and retrogradation of a fluvial-dominated delta system. In order to shorten computational time iterations, a relationship of liquid discharge, large-scale relief, and basin temperature has been used to calculate sediment concentration. The relationship reduces an amount of input parameters required for non-linear optimization, since sediment concentration is not considered an independent input parameter. As previously mentioned, in some implementations, the kernel engine of the forward model is a steady-state 2D advection-diffusion equation in-plane, and a linear model in the vertical direction, while compaction is considered.

Suspended load is the primary mechanism of delta deposit development. Three-dimensional (3D) suspended sediment motion can be expressed (as in Equation (1)) as sediment mass flux out of a control volume plus a mass variation rate in the control volume:

$$\frac{\partial}{\partial t}(\rho s C) + \frac{\partial}{\partial x}(\rho s C u) + \frac{\partial}{\partial y}(\rho s C v) + \frac{\partial}{\partial z}(\rho s C w) = \frac{d}{dt}(\rho s C), \quad (1)$$

where ρs is the mass density of sediment, C is the instantaneous concentration in volume, u is instantaneous velocity in x direction, v is instantaneous velocity in y direction, and w is instantaneous velocity in z direction.

In order to simplify the solution process, a steady-state 2D advection-diffusion equation (as expressed in Equation (2)) is used to describe different grain size transportation in a lateral direction, without considering the suspended load variation in vertical direction:

$$\frac{\partial ul}{\partial x} + \frac{\partial vl}{\partial y} + \lambda I = \frac{\partial}{\partial y}\left(K\frac{\partial I}{\partial y}\right) + \frac{\partial}{\partial x}\left(K\frac{\partial I}{\partial x}\right), \quad (2)$$

where u, y are velocities in the x, y direction respectively, I is sediment inventory or sediment concentration, K is turbulent sediment diffusivity, and λ a first-order removal rate constant.

In the vertical direction, stacking distribution of different grain sizes is calculated (as expressed in Equation (3)) by a linear model:

$$q_{sz} = \Sigma_{i=1}^{N} pi \cdot Cu \quad (3),$$

where $q_{sz}$ is the suspended-load amount of different grain size in volume for each time step, pi is the components of different grain size, N is the number of grain size, C is instantaneous concentration in volume, and u is instantaneous velocity in volume. The stacking order of grain sizes obey geological observation (that is, reverse cycle with coarsening grain component upwards).

Inverse Algorithm

First Step (102)

In the first step of the inverse algorithm, topography (geomorphological information) is used to build an objective function for a sand ratio and other parameter optimization (for example, hydrodynamic input parameters) in each time-step of a forward simulation using a forward model.

In the first step 106, of method 100, a scope of input parameters is defined. In some implementations, the scope can be defined by an input parameter (for example, as illustrated in the previously-defined input file). As a particular example, the scope of the parameter "Discharge" can be defined by:

```
# Initial guess of Discharge range
# Modern river discharge database may be employed as reference for estimation
# <database Web address>
# Minimum of Discharge [m^3/s]      Maximum of X [m^3/s]
          100                                  500
#--------------------------------------------------------------,
``` where the parameter range will range from 100 to 500. Here, the discharge range is constrained by the size of a river channel and statistical result of known global modern river discharge amounts. In other implementations, scope values can be entered by a user or dynamically determined by an automated software process. From 106, method 100 proceeds to 108.

At 108, the defined input parameter scopes are supplied to a PSO algorithm. The PSO algorithm is configured to select a value randomly from the defined scope values for each input parameter with a possible range. For example, the PSO algorithm selects 300 in a first iteration for the Discharge input parameter. For each time step, a group of random particles are initialized to calculate a distribution of different grain sizes by solving a 2D advection-diffusion equation or other nonlinear equation. From 108, method 100 proceeds to 110.

At 110, the selected parameter values are combined with other fixed parameters (for example, from an input file) and supplied into a forward model to generate a simulated topographical result. From 110, method 100 proceeds to 112.

Figure 8A:
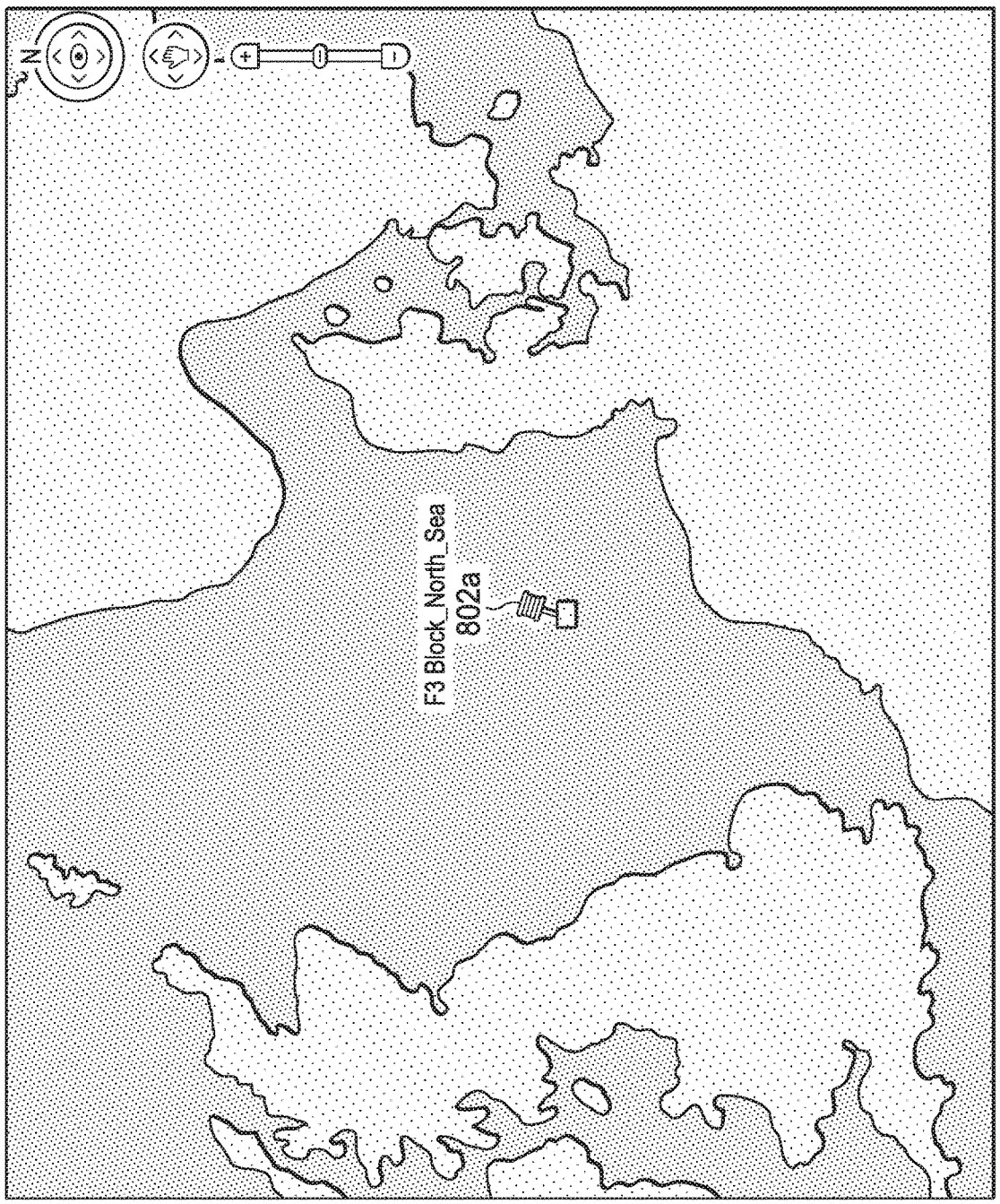
FIG. 8A is a data plot of a location of an F3 block in the North Sea, according to an implementation of the present disclosure.
Figure 8B:
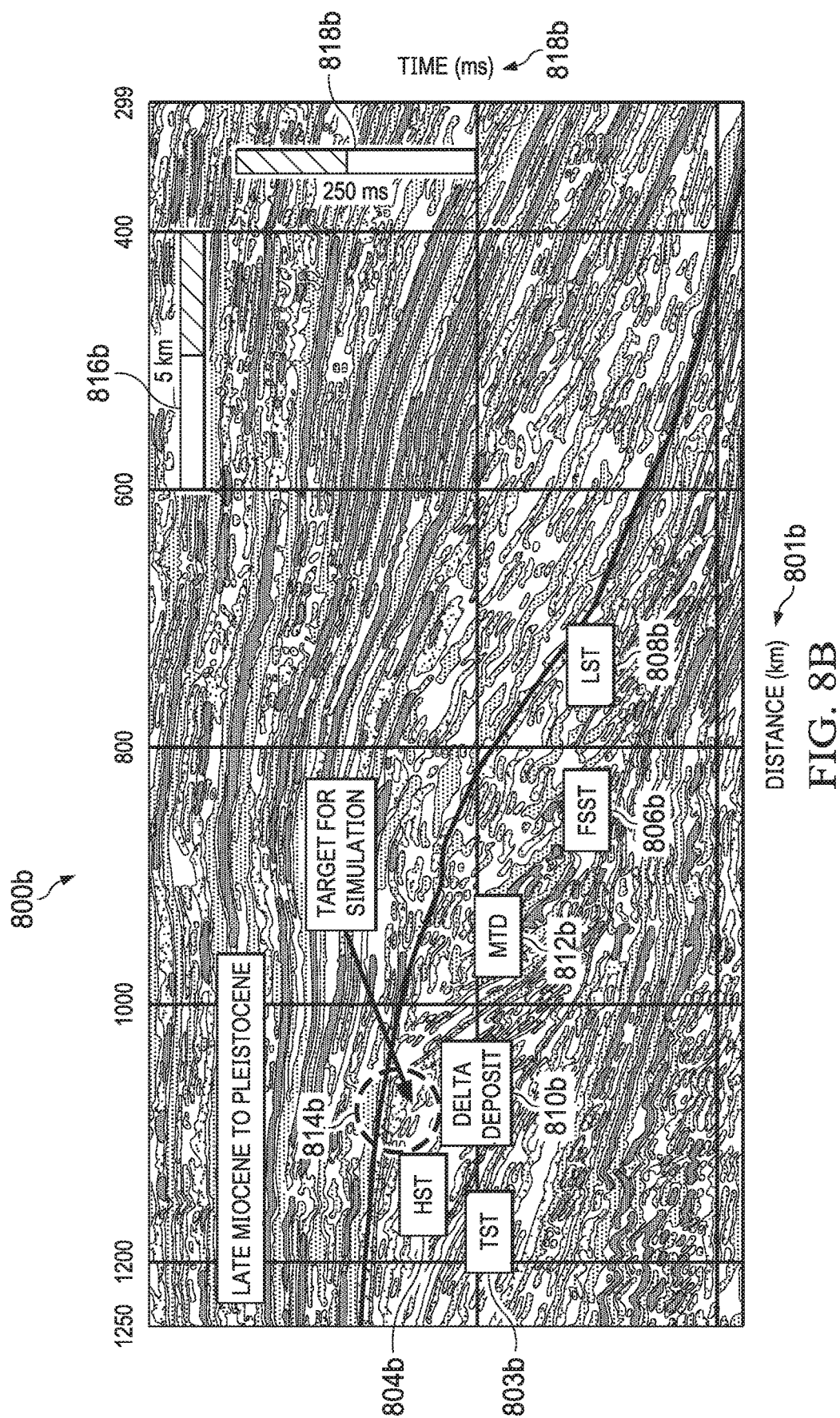
FIG. 8B is a Late Miocene to Pleistocene data plot of four system tracts, according to an implementation of the present disclosure.

At 112, a detailed seismic data interpretation is generated to represent specific seismic features/observed topography (for example, FIG. 8B is an illustration of a clinoform feature). The detailed seismic data interpretation is different from a conventional seismic data interpretation, in that the detailed seismic data interpretation requires a depiction of not only a top surface, but also all time-equivalent seismic events within a target depositional unit constrained by interpreted seismic (strata) surfaces representing a geological surface or topography of each geological time step within the target depositional unit. The interpreted seismic surfaces are preserved (for example, in an ASCII format). From 112, method 100 proceeds to 114.

At 114, a misfit value (D1) is calculated. In some implementations, the L2-Norm of the simulated topography and interpreted seismic surfaces is utilized as an objective function for misfit calculation. For example, the misfit can be calculated by comparing the generated interpreted seismic surface of 112 with the simulated topographical result from 110:

$$D1 = \|\text{Topography}_{simulated} - \text{Topography}_{seismic}\|^2,$$

where D1 represents the Euler distance between simulated topography ($\text{Topography}_{simulated}$, for example, at 110) and observed topography ($\text{Topography}_{seismic}$, for example, at 112). From 114, method 100 proceeds to 116.

At 116, a linear optimization algorithm (for example, an augmented Lagrange multiplier (ALM)) is applied to minimize the calculated misfit value of 114. The resultant minimization value is used as an optimization in percentage (%) of grain size component values. Optimized grain size components provided by the ALM are classified (for example, as sand and mud), and their components are added respectively to generate a sand ratio. From 116, method 100 proceeds to 118.

At 118, 108-116 is iterated one or more times to update input parameters until an optimal solution is found according to the ALM-calculated misfits. After all particles are calculated, the optimal solution has been found. With the optimal solution, different grain sizes are classified (for example, as sand and mud) and their components are added, respectively, to generate an estimated optimized sand ratio. From 118, method 100 proceeds to 120.

At 120, a data set of the generated estimated optimized sand ratio and hydrodynamic input parameters (for example, Discharge and velocity) is produced. The estimated optimized sand ratio and hydrodynamic parameters will be used as fixed input parameters in the Second Step (104). From 120, method 100 proceeds to 122.

Second Step (104)

In the second step of the inverse algorithm, components of different grain sizes are optimized. The estimated optimized sand ratio and hydrodynamic parameters of 120 are fixed input parameters of the second step. Components of different grain sizes are required for optimization under the constraint of the sand ratio estimated from the first step (102). GA is introduced as the engine of inversion. Correlation and residual error are used to rank similarity between simulation and observation on a 2D graph. At the beginning of the optimization process, components of different grain sizes formed a high dimensional grid with specified intervals and are supplied to the GA as a first generation. In some implementations, only the top 40% seeds with high correlation and low residual error are preserved as parents for a subsequent generation. After four generations, the seed with a highest correlation and lowest residual error is recognized as the optimal seed.

At 122, the distribution scope of components of different grain size is constrained by the fixed input optimized sand ratio. For example, there are four types of grain sizes, including coarse sand, fine sand, siltstone, and mudstone. Coarse sand and fine sand are classified as sand. Siltstone and mudstone are classified as mudstone. Based on the result of the first step (102), the sand ratio is known to be 0.5, meaning 50% sandstone and 50% mudstone. From 122, method 100 proceeds to 124.

At 124, a GA is used to determine a proportion of each grain size. The range of each grain size is from 0 to 50%. The GA is performed to generate components of different grain sizes within the scope. From 124, method 100 proceeds to 126.

At 126, all parameters are supplied to the forward model (for example, as used in 114) to generate a simulation result. From 126, method 100 proceeds to 128.

At 128, thickness and porosity data are extracted from well data. From 128, method 100 proceeds to 130.

At 130, the thickness and porosity data from 128 are combined with the simulation result of 126 to build a misfit function:

$$\|Thickness_{simulated} - Thickness_{wells}\|^2 + \|Porosity_{simulated} - Porosity_{wells}\|^2,$$

where $Thickness_{wells}$ represents lithology thickness extracted from wells, $Thickness_{simulated}$ represents lithology thickness extracted from simulation, $Porosity_{wells}$ represents porosity extracted from wells, and $Porosity_{simulated}$ represents porosity extracted from simulation. From 130, method 100 proceeds to 132.

At 132, the misfit function (130) is used with the GA to iterate (124-130) one or more times until optimized components of different grain sizes are obtained. From 132, method 100 proceeds to 134.

At 134, the optimized hydrodynamic parameters obtained from the first step (102) and components of different grain sizes obtained from the second step (104) are combined together as an output result to be used for subsequent forward modeling. After 134, method 100 stops.

Example Results

Case 1: Synthetic Case Verification

In a particular implementation, the described methodology was tested with the described 2D hydrodynamic forward model on a synthetic, geologically-reasonable forward simulation result as observed data. In the synthetic dataset, six input variables, including discharge and components of five grain sizes, were calibrated. The most optimal determined solution had a correlation of 97% and a residual error of 1.86, suggesting that the estimated input values were very close to true values.

Figure 2A:
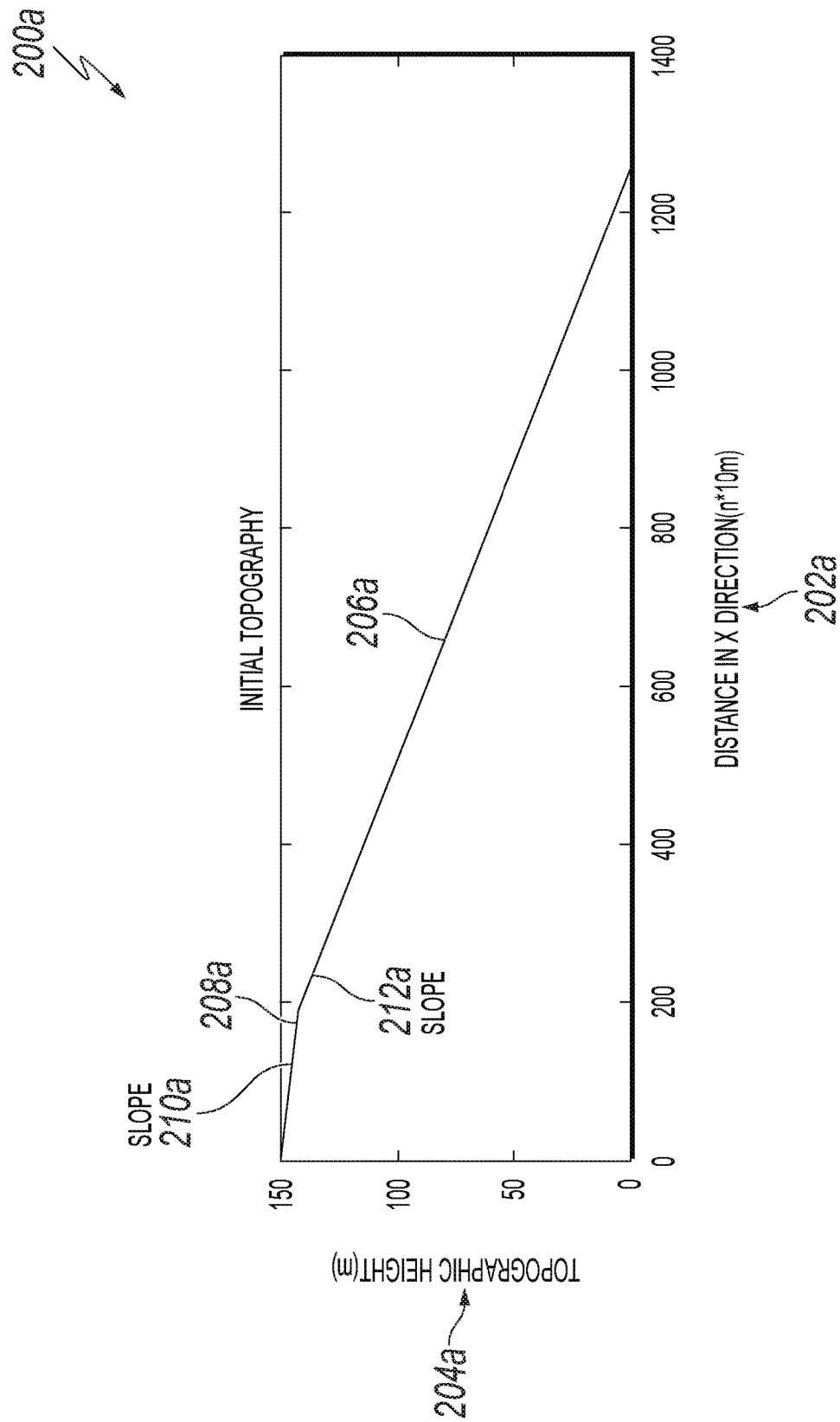
FIG. 2A is a graph illustrating an example initial topography of a forward model, according to an implementation of the present disclosure.

FIG. 2A is a graph illustrating an example initial topography 200a of a forward model, according to an implementation of the present disclosure. FIG. 2A has a horizontal axis 202a representing a Distance n (meters (m)) times 10 m and a vertical axis 204a representing topographical height (m). The topographical value is represent by 206a. A forward simulation was conducted to provide test data at the beginning. The forward simulation was performed on a ramp 12.5 kilometers (km) long and 150 (m) high (as can be seen in FIG. 2A). The knickpoint 208a was located about 2 km away from the left border. The slope 210a is about 2 degrees above the knickpoint 208a. The slope 212a is about 8 degrees below the knickpoint 208a.

Figure 2B:
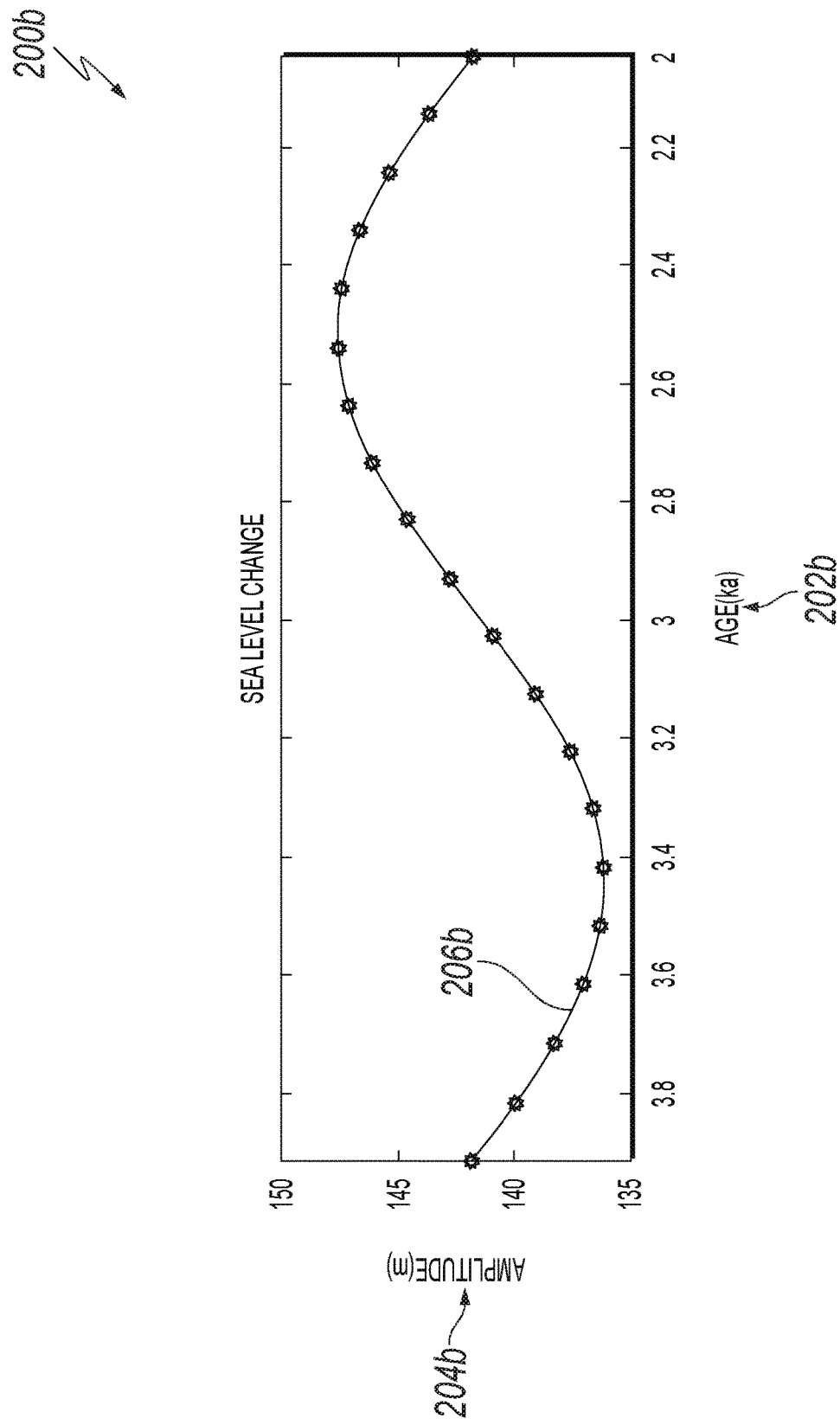
FIG. 2B is a graph illustrating an example sinusoidal sea-level curve, according to an implementation of the present disclosure.

FIG. 2B is a graph illustrating an example sinusoidal sea-level curve 200b, according to an implementation of the present disclosure. FIG. 2B has a horizontal axis 202b representing Age in kilo annum (ka) and a vertical axis 204b representing Amplitude (m). In FIG. 2B, a sinusoidal fluctuation curve 206b ranges from 136 m to 149 m with a 100 year time-step and 2.0 ka duration used as sea level.

A stochastic discharge model consisting of a steady average discharge composition (500 m3/s) and a stochastic composition generated by a Markov process based climate-dependent discharge time series was used to produce variable discharge parameter for each step. Concentration was calculated by a relationship between catchment properties and river discharge series. Five classes of sediments, including coarse sand (1.2 millimeters (mm)), medium sand (0.3 mm), fine sand (0.15 mm), silt sand (0.06 mm), and clay (0.003 mm) with fixed components (35%, 10%, 15%, 20%, 20%, respectively) in each step were incorporated in the forward model.

FIG. 3A is a data plot 300a illustrating development of delta lobe along a centerline, according to an implementation of the present disclosure. FIG. 3A has a horizontal axis 302a representing Width (m) in a y direction times 30 m and a vertical axis 304a representing Distance (m) in an x direction times 10 m. A total of 20 time steps were used to emulate the development of a fluvial-dominated delta system. A delta lobe prograded 306a along a centerline 308a when sea level fell and retrograded 310a basinward when sea level rose.

Figure 3B:
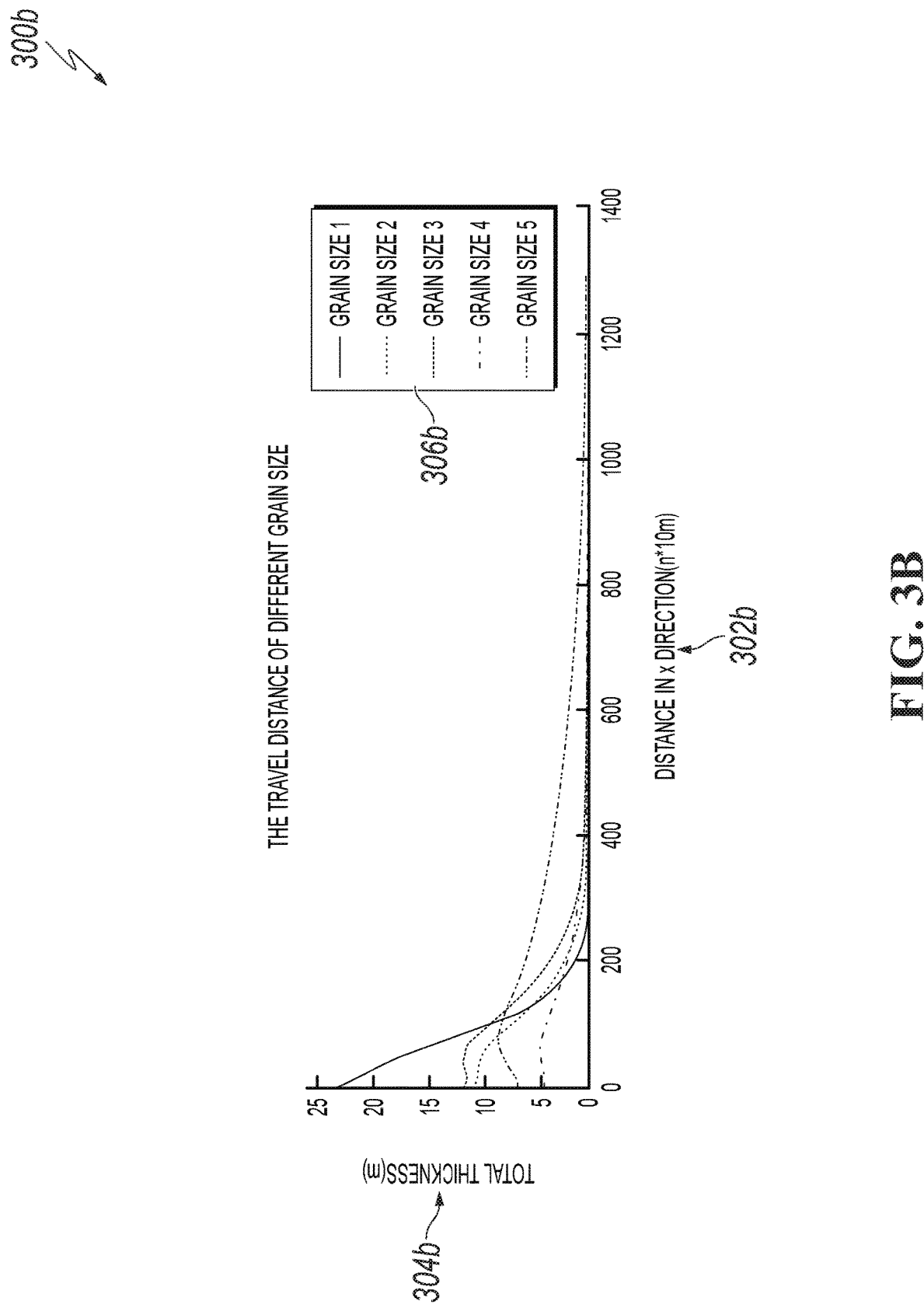
FIG. 3B is a graph illustrating travel distance of different grain sizes, according to an implementation of the present disclosure.

FIG. 3B is a graph 300b illustrating travel distance of different grain sizes, according to an implementation of the present disclosure. FIG. 3B has a horizontal axis 302b representing Distance (m) in an x direction times 10 m and a vertical axis 304b representing a Total Thickness (m). Travel distances of five grain sizes with different color (306b) are depicted. Grain sizes from 1 to 5, represent coarse sand to mud, respectively. The coarse grain size exhibits an s-shape 308b of depositional curve with short travel distance, while the mud exhibits a flat-shaped curve 310b. This feature may be attributed to the rapid loss of momentum of grains the more course a grain size is and demonstrate that fine sized deposits travel much longer distances compared to coarse sized deposits.

Figure 3C:
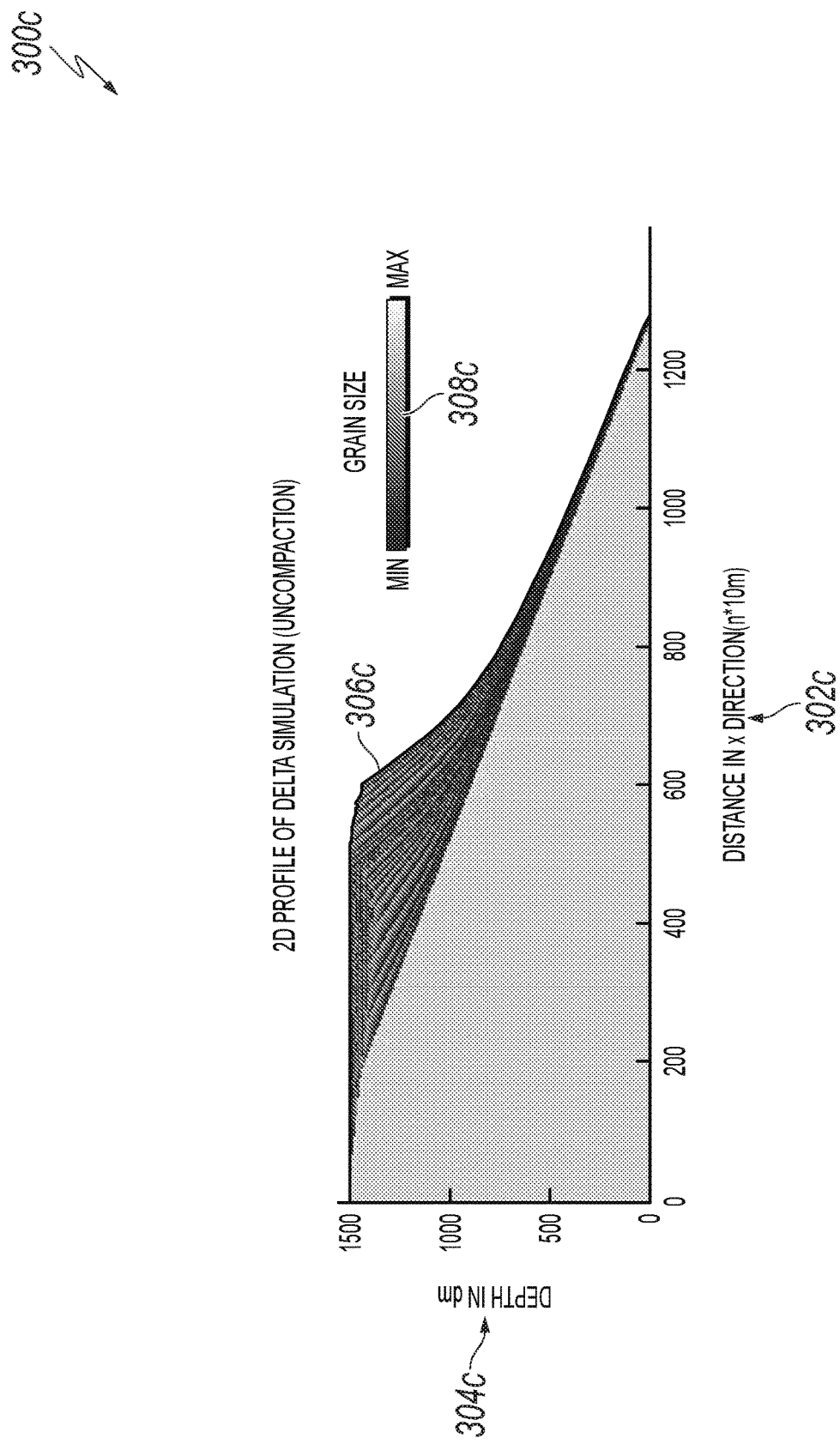
FIG. 3C is a data plot illustrating a 2D profile of a delta simulation without compaction, according to an implementation of the present disclosure.

FIG. 3C is a data plot 300c illustrating a 2D profile of a delta simulation without compaction, according to an implementation of the present disclosure. FIG. 3C has a horizontal axis 302c representing Distance (m) in an x direction times 10 m and a vertical axis 304c representing Depth in decimeters (dm). The illustrated 2D profile shows clinoform 306c (a sloping depositional surface of a major morphological feature giving seismic expression) evolution without compaction. Colors from black to grey (as in Grain size bar 308c) represent grain sizes from fine to coarse, respectively.

Figure 3D:
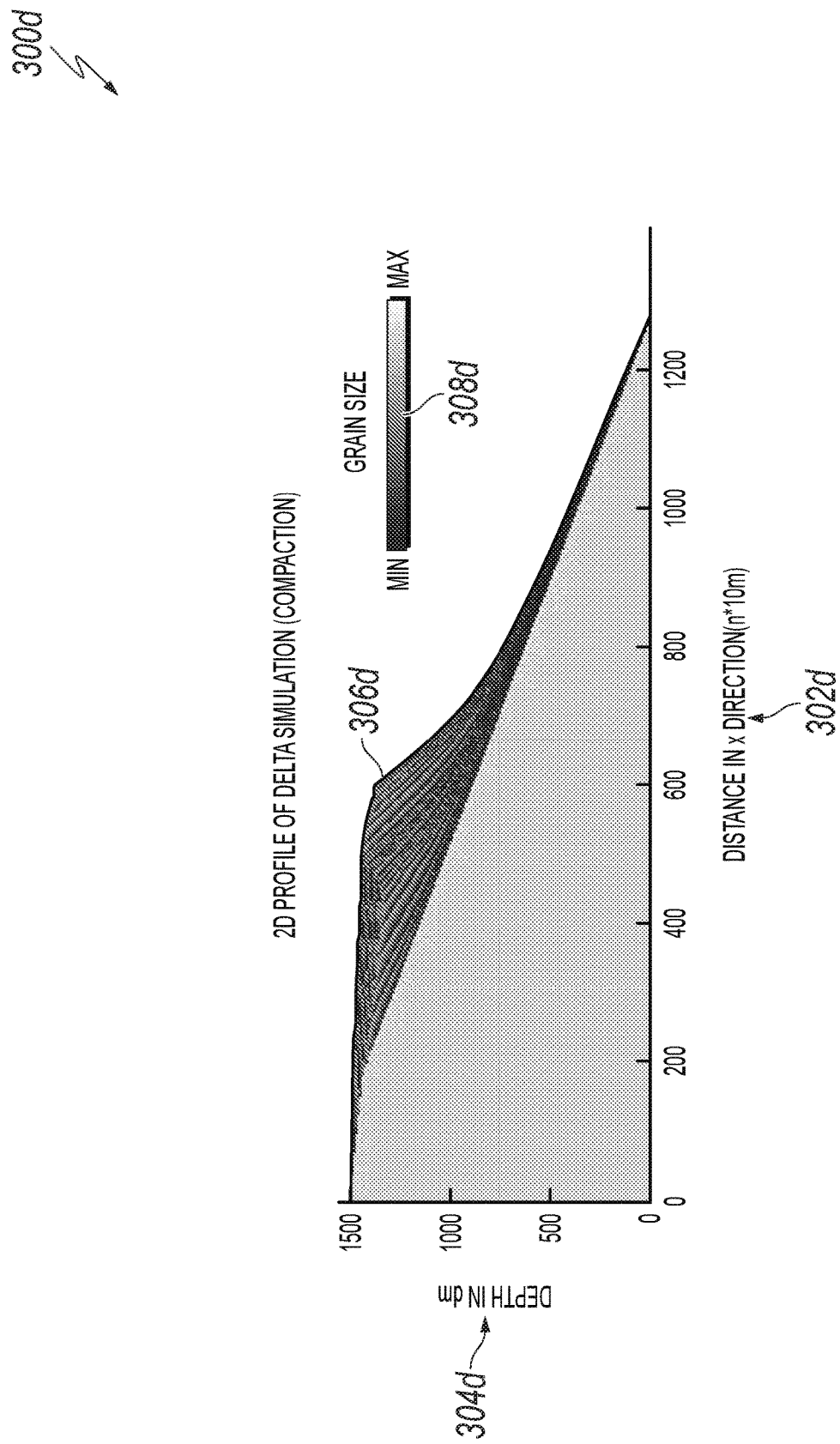
FIG. 3D is a data plot illustrating a 2D profile of a delta simulation with compaction, according to an implementation of the present disclosure.

FIG. 3D is a data plot 300d illustrating a 2D profile of a delta simulation with compaction, according to an implementation of the present disclosure. FIG. 3D has a horizontal axis 302d representing Distance (m) in an x direction times 10 m and a vertical axis 304d representing Depth (dm). The illustrated 2D profile shows clinoform evolution 306d without compaction. Colors from black to grey (as in Grain size bar 308d) represent grain sizes from fine to coarse, respectively.

Figure 4A:
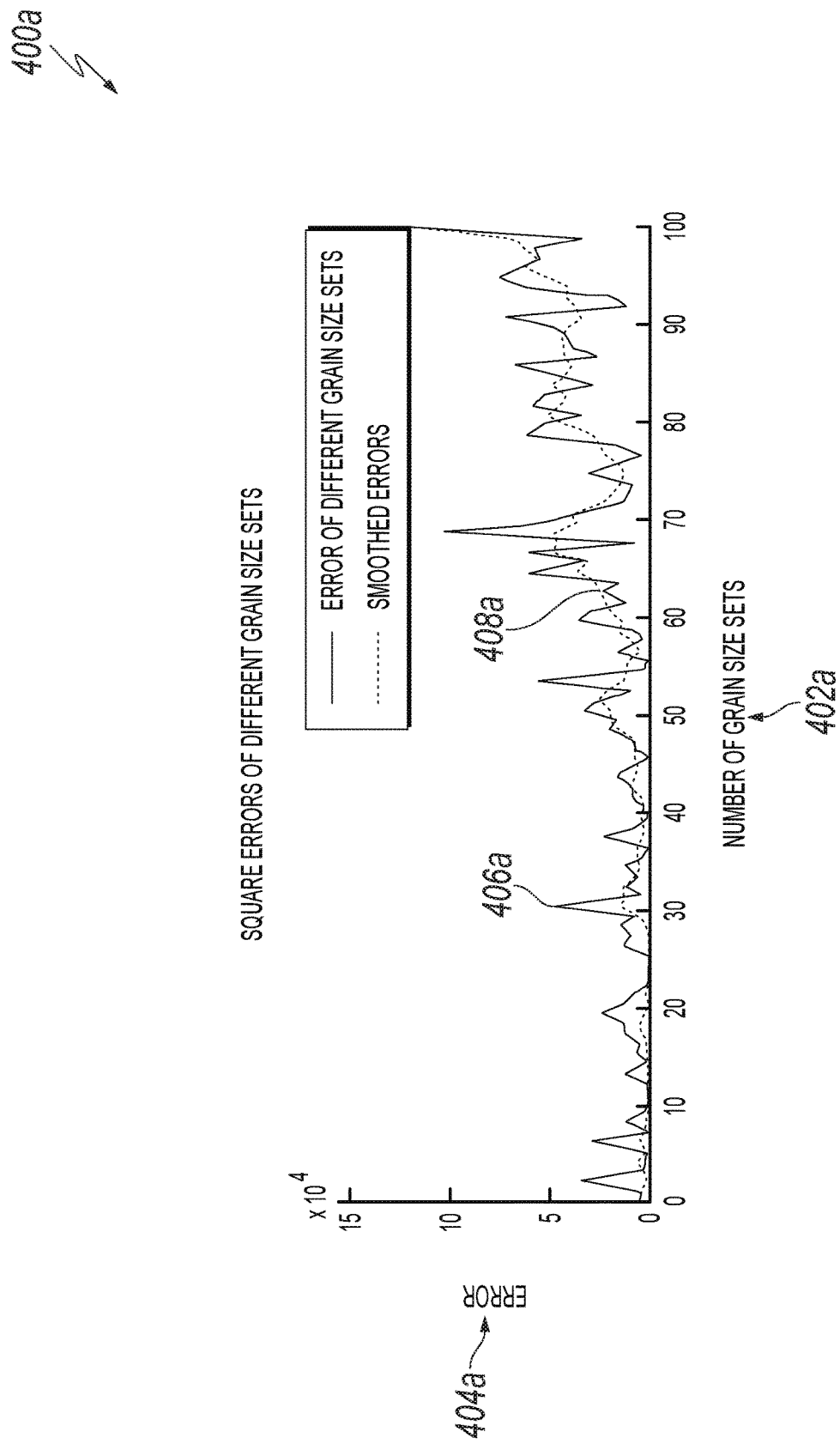
FIG. 4A is a graph illustrating that a cost function of grain size 1 exhibits non-convex features when multiple (more than two) grain sizes are considered, according to an implementation of the present disclosure.
Figure 4B:
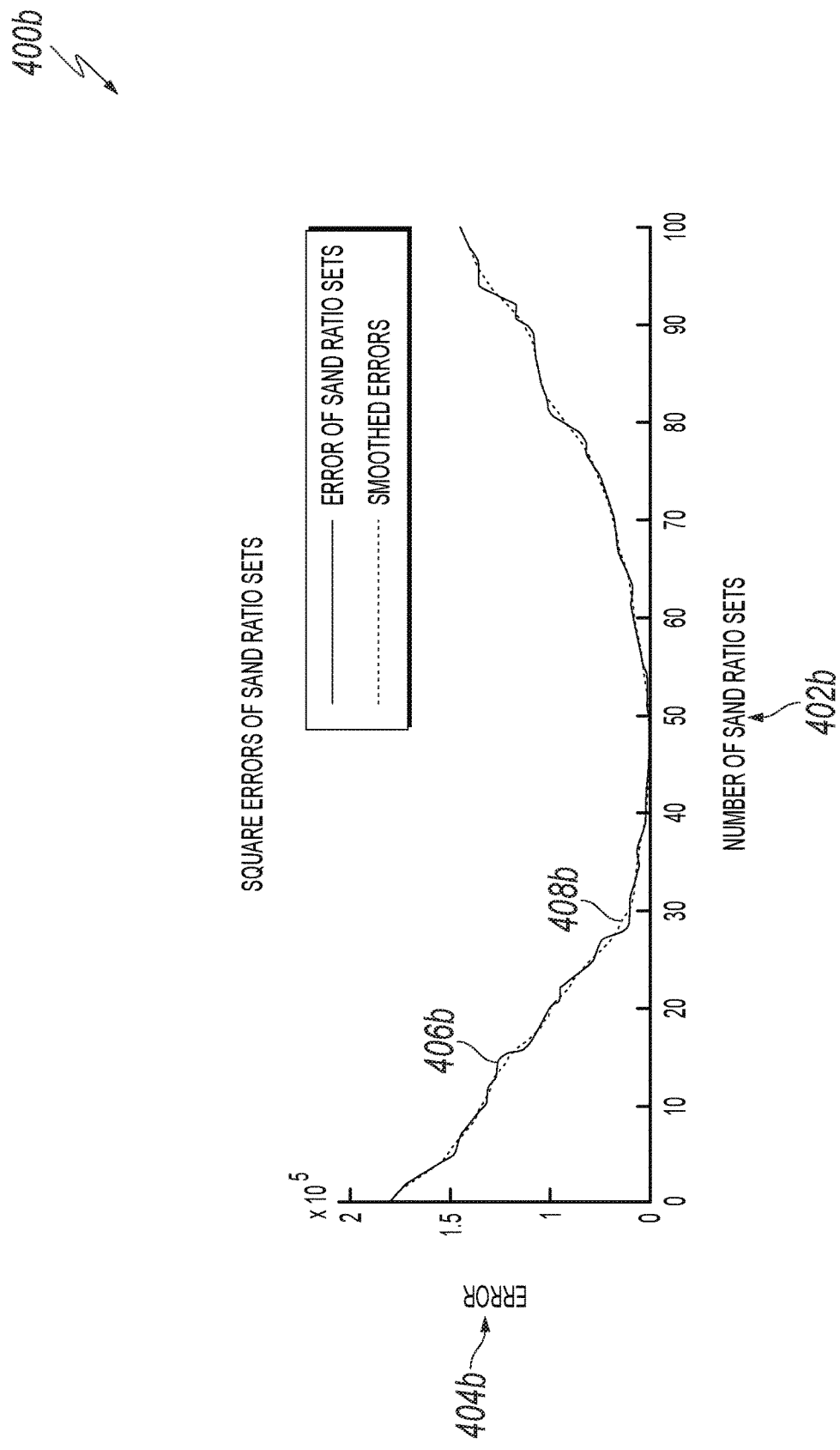
FIG. 4B is a graph illustrating that a cost function of grain size 1 exhibits convex features when only a sand ratio is considered, according to an implementation of the present disclosure.

With respect to FIGS. 4A and 4B, six hydrodynamic parameters, including fluvial discharge and sediment components of different grain sizes were permitted to vary in the described inverse optimization process, in which others were held constant at correct values. In the first step (102) of inversion, simulated surfaces extracted from 20 time steps of forward simulation were used as topography to build an objective function of each piecewise inverse process. In each time step, PSO initialized a set of discharge values at the beginning, ALM was applied to optimize the components of different grain sizes according to the given discharge values and to calculate misfits of the objective function. The optimization and updating strategy was then performed by PSO to update discharges and select a best solution with a minimum misfit. The optimization stopped and moved to a next time step until at least 95% accuracy was reached or a number of iterations exceeded a maximum of 60.

FIG. 4A is a graph 400a illustrating that a cost function of grain size 1 exhibits non-convex features when multiple (more than two) grain sizes are considered, according to an implementation of the present disclosure. FIG. 4A has a horizontal axis 402a representing a Number of grain size sets and a vertical axis 404a representing Errors ($\times 10^4$). Line 406a represents Error of different grain size sets, while line 408a represents smoothed errors. Components of different grain sizes were obtained through described linear optimization. However, the cost function of each grain size is actually a non-convex function when multiple (more than two) grain sizes are considered. The linear optimization method is inclined to generate a local minimum other than to find a global optimization.

FIG. 4B is a graph 400b illustrating that a cost function of grain size 1 exhibits convex features when only a sand ratio is considered, according to an implementation of the present disclosure. FIG. 4B has a horizontal axis 402b representing a Number of sand ratio sets and a vertical axis 404b representing Errors ($\times 10^5$). Line 406b represents Error of sad ratio sets, while line 408b represents smoothed errors. To overcome the identified deficiency of FIG. 4A, five grain sizes were classified into sand and mud according to geological classifications. Their components were added respectively to calculate a sand ratio and a mud ratio. The described methodology squeezed the four dimensional cost function (that is, five components with four degrees-of-freedom) into one dimension under the strong constraint of geological concepts and generated a smooth cost function of a sand ratio. The prediction of the sand ratio became stable and reliable.

Figure 5:
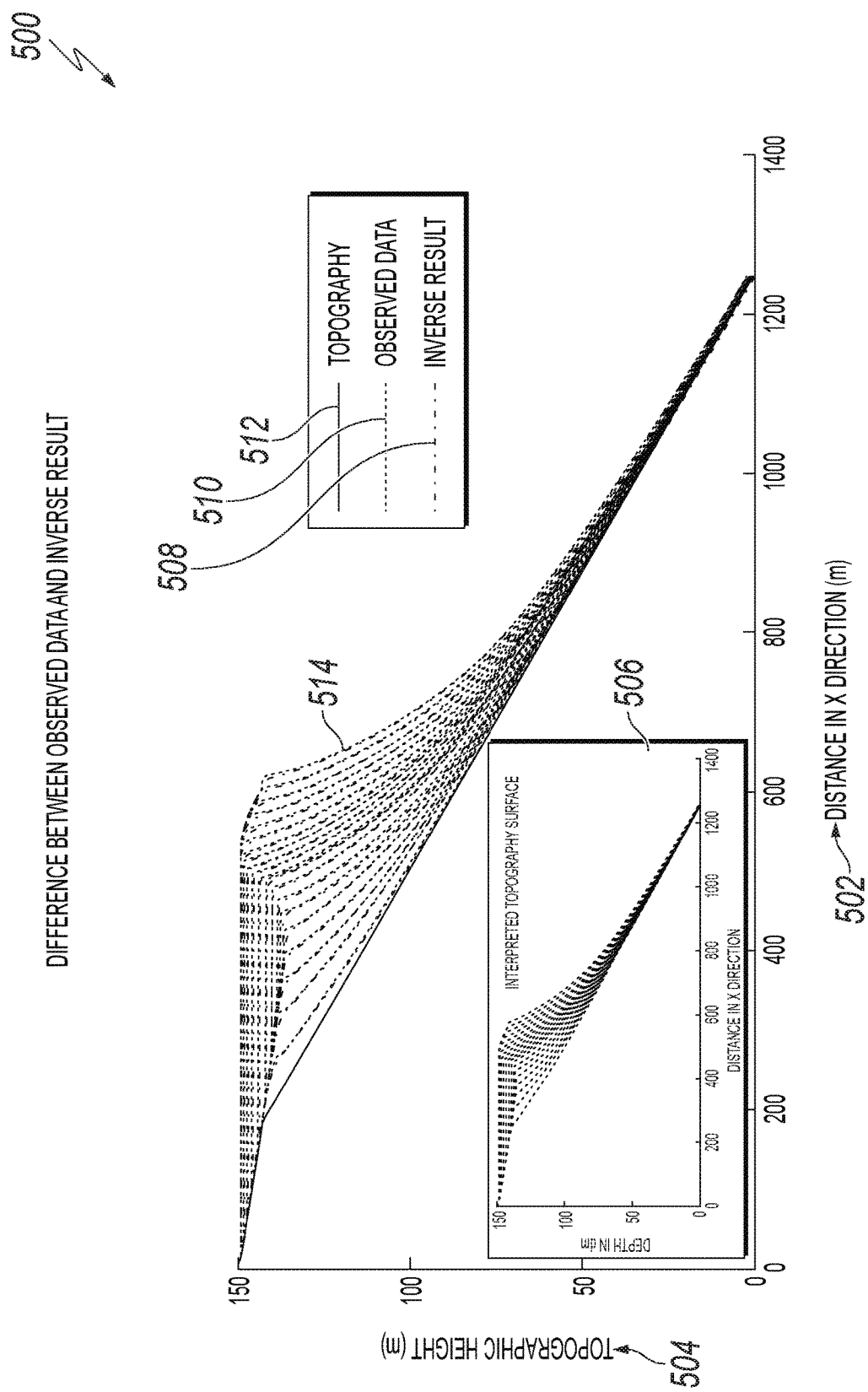
FIG. 5 are graphs illustrating a difference between observed data and an inverse result, according to an implementation of the present disclosure.

FIG. 5 are graphs illustrating a difference 500 between observed data and an inverse result, according to an implementation of the present disclosure. FIG. 5 has a horizontal axis 502 representing Distance (m) in an x direction and a vertical axis 504 representing Topographic height (m). An original interpreted topography surface 506 is inset in the bottom left of FIG. 5. A comparison between an inverse result 508 and observed data 510 against actual Topography 512 as in graph 514 shows that the simulation inverse result 508 almost overlaps with the interpreted topography surface 506, suggesting discharge and sand ratio were successfully optimized through the combination of PSO and ALM with more than 95% accuracy. The low frequency trend of the observation was well captured.

Figure 6A:
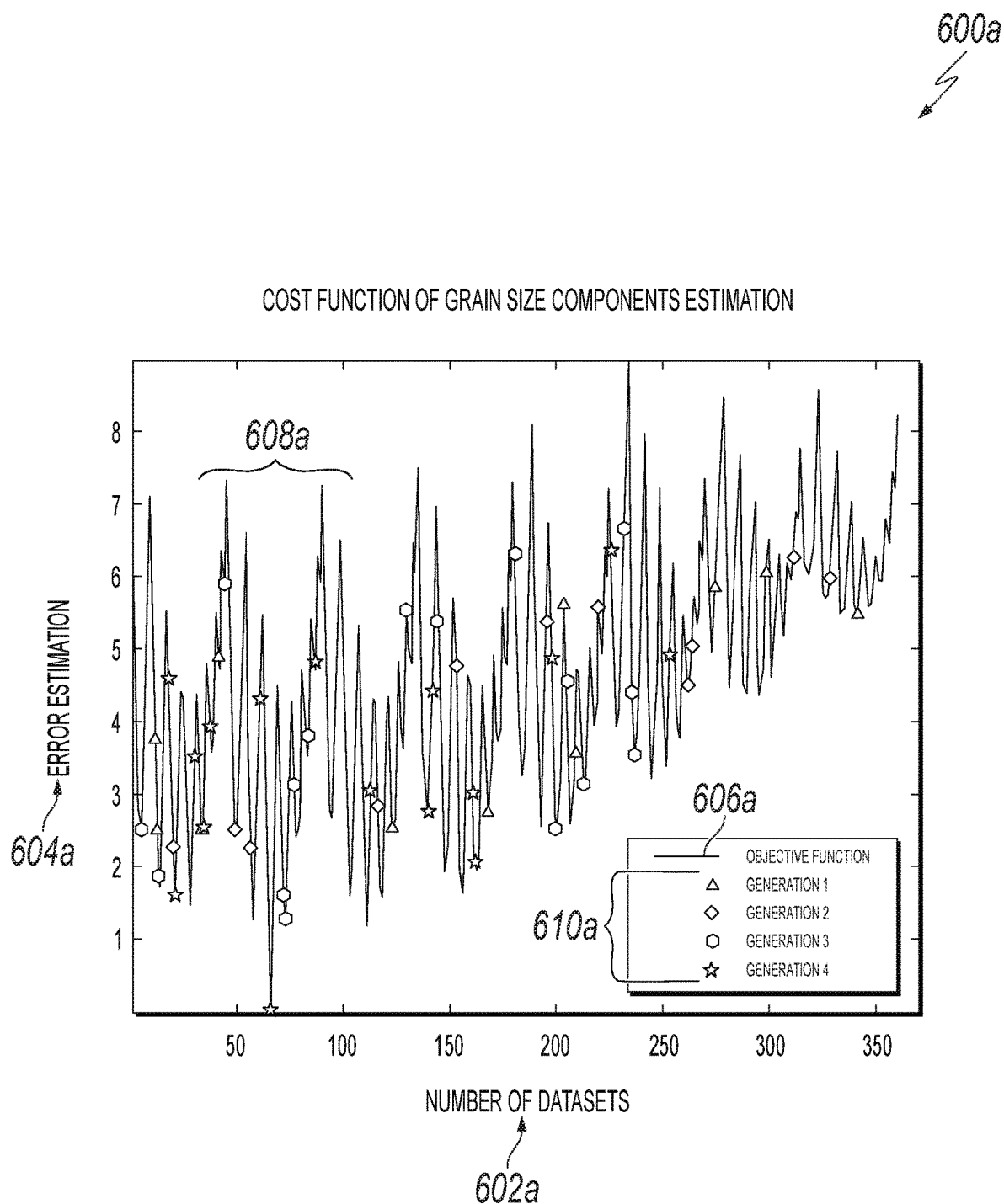
FIG. 6A is a graph illustrating a Genetic Algorithm (GA) implemented for grain size optimization on a high-frequency oscillation cost function, according to an implementation of the present disclosure.

FIG. 6A is a graph 600a illustrating a GA implemented for grain size optimization on a high-frequency oscillation cost function, according to an implementation of the present disclosure. FIG. 6A has a horizontal axis 602a representing a Number of datasets and a vertical axis 604a representing Error estimation as a scale representing the Euclidean distance of the simulation result and well data.

In the second step (104) of inversion, components of different grain sizes were required for optimization. Porosity (%) and thickness (m) of different grain sizes extracted from well data were used to build an objective function reflecting a high-frequency difference between simulation and observation. The objective function 606a exhibits significant oscillating characteristics (for example, 608a) and therefore, cannot be optimized by a linear algorithm. GA was executed as an objective function (606a) engine to search for a global optimization result. At the beginning, fifteen individuals evenly distributed in the solution space were initialized by GA as a first generation of candidate. The fitness of each individual is evaluated by correlation and residual error. Those more fit individuals are selected to form new generations through crossover and mutation. After four generations (610a), 60 individuals were generated and evaluated.

Figure 6B:
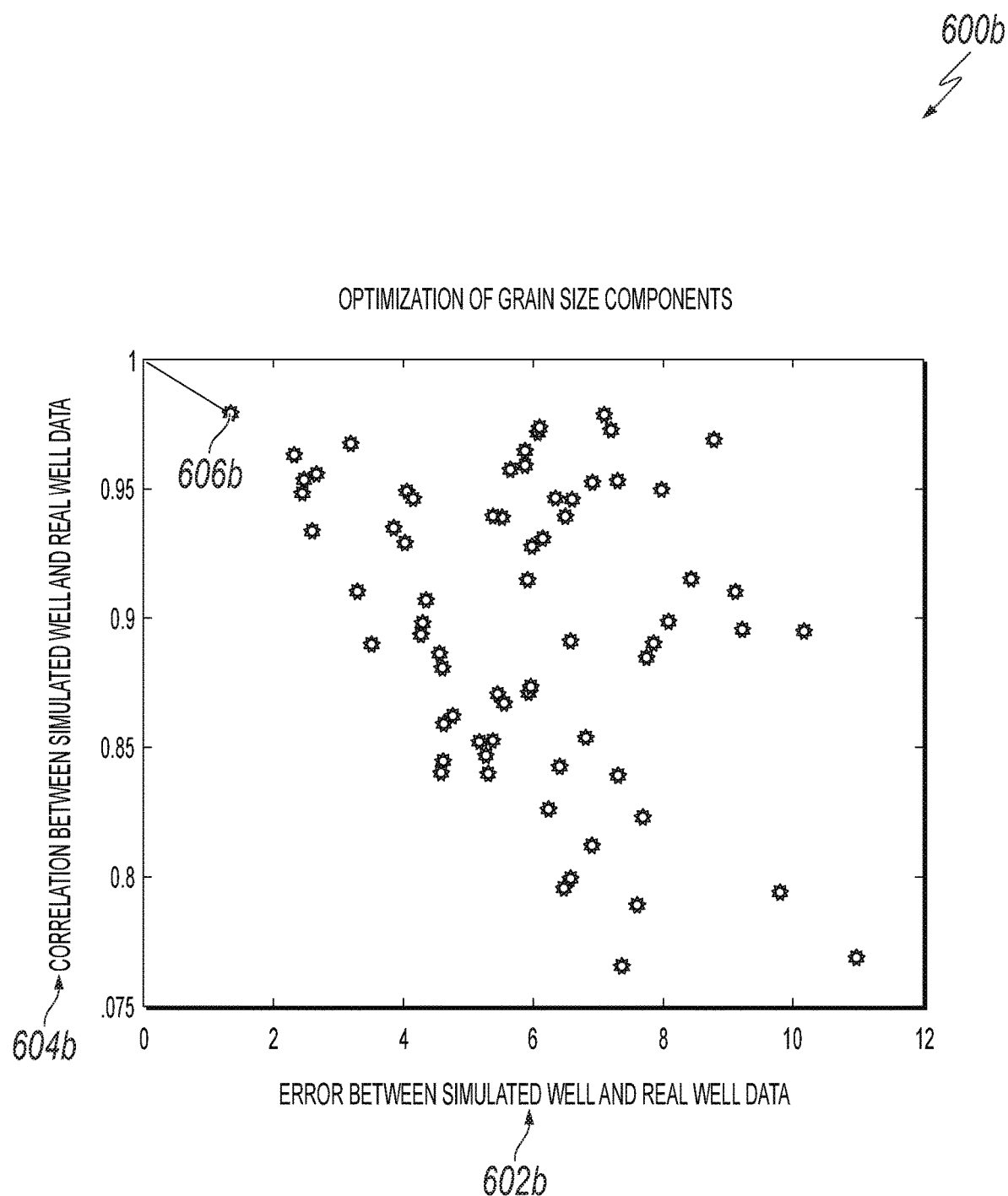
FIG. 6B is a graph illustrating selection of global optima by using residual error and correlation, according to an implementation of the present disclosure.

FIG. 6B is a graph 600b illustrating selection of global optima by using residual error and correlation, according to an implementation of the present disclosure. FIG. 6B has a horizontal axis 602b representing Error between simulated well and real well data and a vertical axis 604b representing Correlation between simulated well and real well data. As in FIG. 6A, the vertical axis represents Error estimation as a scale representing the Euclidean distance of the simulation result and well data. The optimal solution 606b with a highest correlation (97%) and lowest residual error (1.86) was found.

FIG. 7 are graphs 700 illustrating a comparison between simulated well data and real (observed) well data, according to an implementation of the present disclosure. FIG. 7 includes three wells (well 1 701a, well 2 701b, and well 3 701c. Each well is represented by two separate graphs of simulated well data and real well data (that is, Well 1 701a-702a and 702b, respectively; Well 2 701b-704a and 704b, respectively; and Well 3 701c-706a and 706b, respectively). Each graph (for example 702a) has a horizontal axis representing Lithology (for example, a category) and a vertical axis representing Thickness (m).

In FIG. 7, the three wells 701a, 701b, and 701c were extracted from 4000, 6000, and 8000 m, respectively, from the forward model. For each well, the simulated well data is presented in the left panel (for example, 702a) and the real well data is presented in the right panel (for example, 702b). Each well has a horizontal axis 708 representing Lithology and a vertical axis 710 representing Thickness (m).

The optimal parameters generated by the two-step inverse algorithm were input into the forward model for simulation. The three wells 701a, 701b, and 701c that were extracted from the simulation result were compared with real (observed) well data. As can be seen, each well demonstrates a marked similarity between the simulated well data and the real well data, suggesting that the two-step inverse algorithm can be utilized for parameter optimization successfully.

Case 2: Real Case Verification

In the real data test case, three parameters, including discharge, source velocity and sand ratio were varied for optimization. The final result exhibited about 90% similarity with interpreted seismic geomorphology and high consistency with well data, indicating that the described methodology had successfully been applied on real case study.

FIG. 8A is a data plot 800a of a location of an F3 block in the North Sea, according to an implementation of the present disclosure. The Netherlands Offshore F3 seismic survey was collected for inverse stratigraphic modeling verification. The data was derived from OPENDTECT free and public dataset (generated by dGB Earth Sciences, The Netherlands). F3 Block North Sea 802a is a block covered by a 3D seismic survey in the Dutch sector of the North Sea.

FIG. 8B is a Late Miocene to Pleistocene data plot 800b of four system tracts, according to an implementation of the present disclosure. The horizontal axis 801b represents Distance (km), while the vertical axis 802b represents Time in milliseconds (ms). According to sequence stratigraphic analysis, four system tracts in Late Miocene to Pleistocene strata (that is, transgressive (TST) 803b, highstand (HST) 804b, falling stage (FSST) 806b, and lowstand (LST) 808b), from bottom to top, are recognized on the profile. As can be seen, HST 804b is dominated by a fluviodeltaic system (delta deposit 810b) with large scale sigmoidal clinoform. The delta deposit 810b consists of sand and shale, with an overall high porosity. Bright spots observed on the profile may be attributed to biogenic gas pockets. FSST 806b is dominated by mass transport deposits (MTD) 812b. "Target for Simulation" area 814 is dominated by a clinoform feature, which is an indicator of deltaic system. Horizontal scale 816b and vertical scale 818b provide scale for the horizontal and vertical axes, respectively.

Figure 8C:
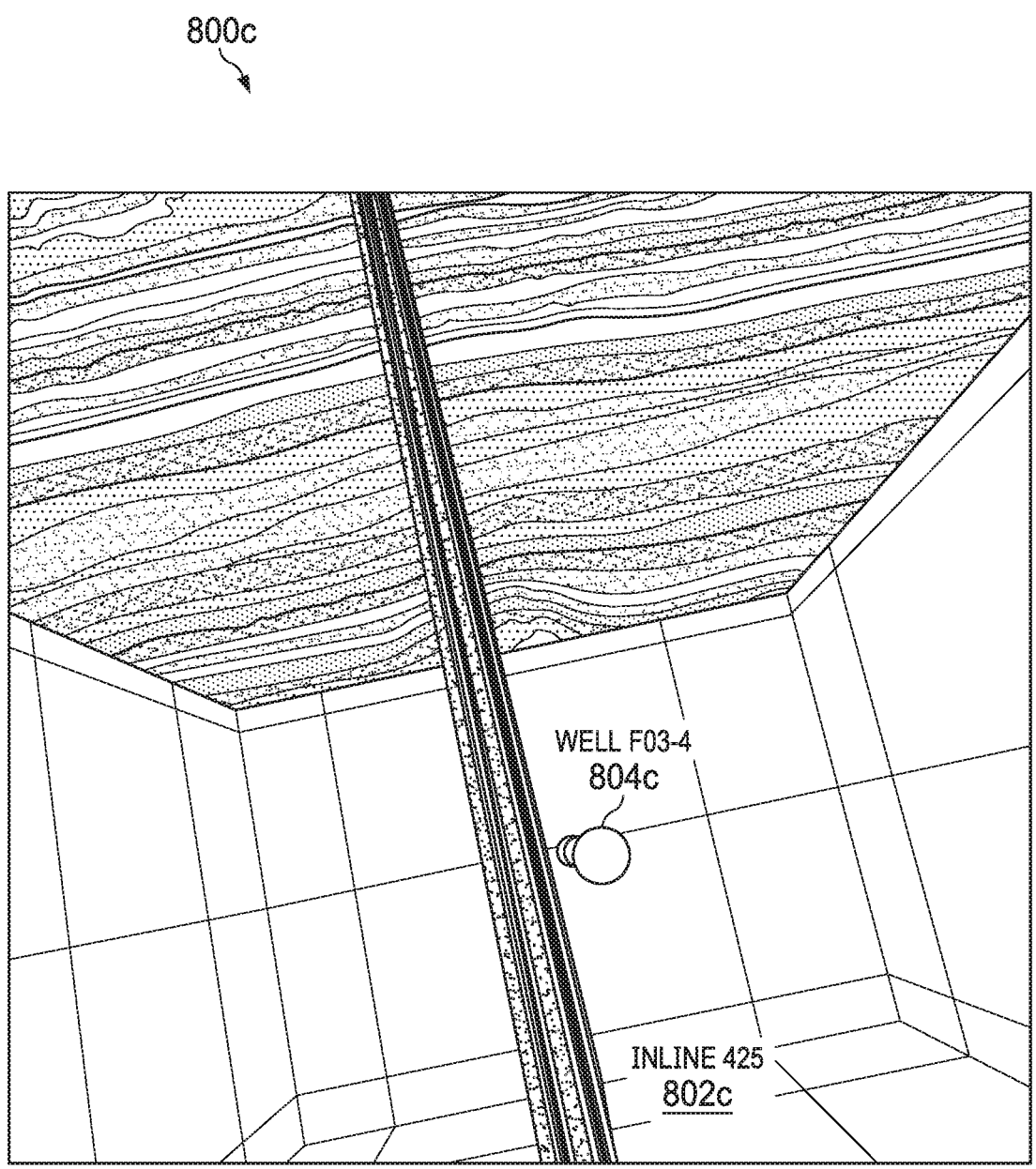
FIG. 8C is a data plot of a location of an inline and a well, according to an implementation of the present disclosure.

FIG. 8C is a data plot 800c of a location of an inline and a well, according to an implementation of the present disclosure. In FIG. 8C, the inline is identified as Inline 425 802c and the well as Well F03-4 804c. A detailed interpretation of Inline 425 802c located in the center of the F3 survey was employed to provide seismic geomorphological information. The profile had been converted to a depth domain through seismic velocity field data. Since no grain size data was available for this verification, the delta deposit 810b was simply divided into sand and mud with assumed reasonable grain sizes (that is, 0.2 mm and 0.002 mm, respectively). Though the second step of inverse algorithm was not utilized for calibration in this case because of this prior assumption, Well F03-4 804c, which penetrated the delta deposit 810b and is located about 400 m away from Inline 425 802c, was still used for a visual comparison of a simulation result and a porosity curve computed by a sonic log. In the described implementation, a sea level curve was determined through a commonly used wheel transformation of a seismic profile, and a top surface of TST 803b (an interpreted seismic surface) was used as topography. Four parameters including the velocity at source, discharge, and components of two grain sizes were optimized in this case. Sea level and topography are two required input files for simulation. In other implementations, other data and methods consistent with this disclosure can be used for topography representation and for sea level curve estimation.

Figure 9A:
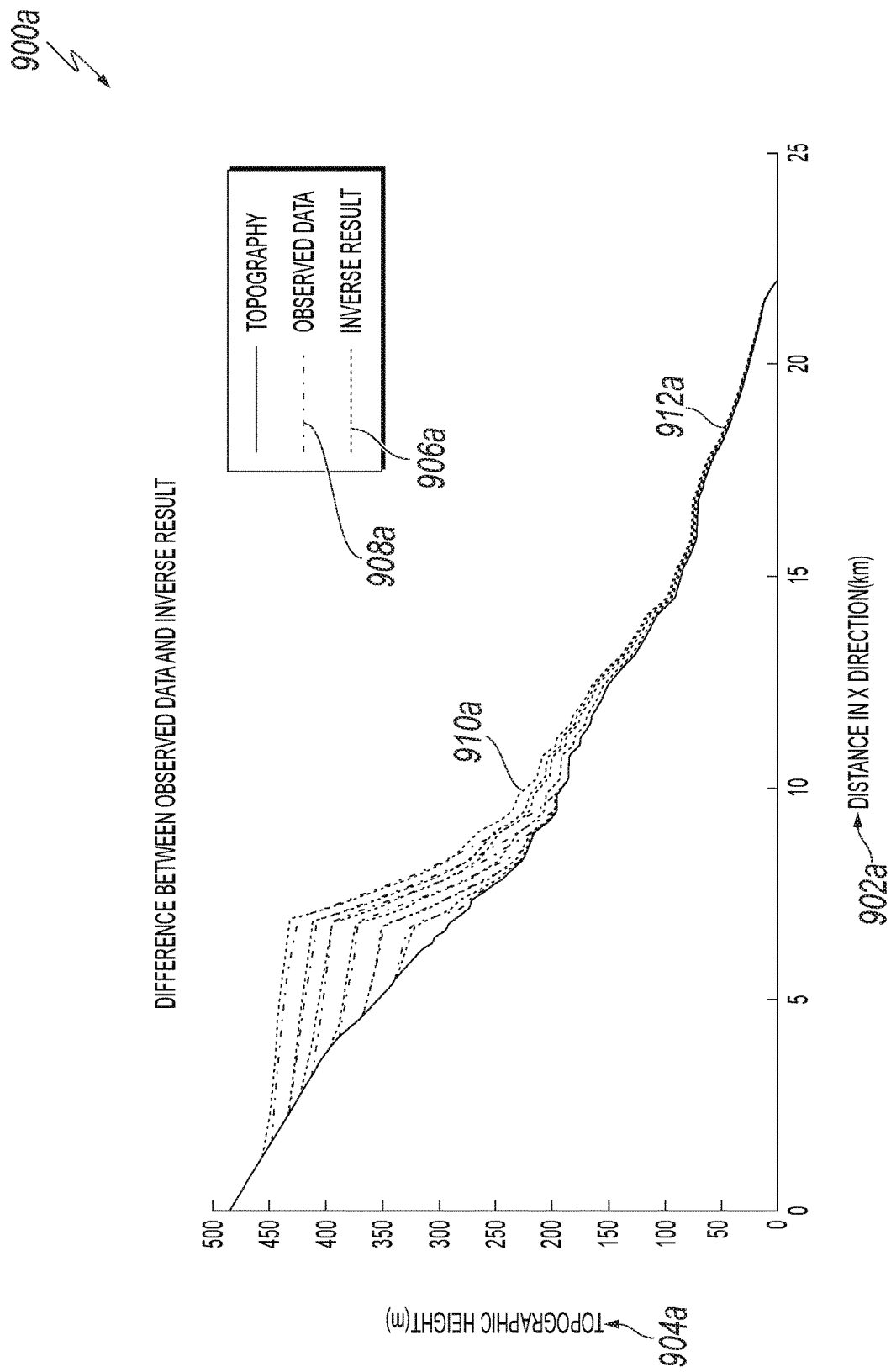
FIG. 9A is a graph illustrating a difference between observed inline profile data and an inverse (simulation) result, according to an implementation of the present disclosure.

FIG. 9A is a graph 900a illustrating a difference between observed inline profile data and an inverse (simulation) result, according to an implementation of the present disclosure. FIG. 9A has a horizontal axis 902a representing Distance (km) in an x direction and a vertical axis 904a representing a Topographic height (m). A comparison of the inverse result 906a and observed seismic geomorphology data 908a as in overlapping data 910a exhibits a high similarity (approximately 90%). The residual error (approximately 10%) can be attributed to the toe of the delta front. This misfit may be attributed to the limitation of seismic resolution. Note that some seismic events merge together at the base (for example, at 912a) since the deposits becomes too thin in this area.

Figure 9B:
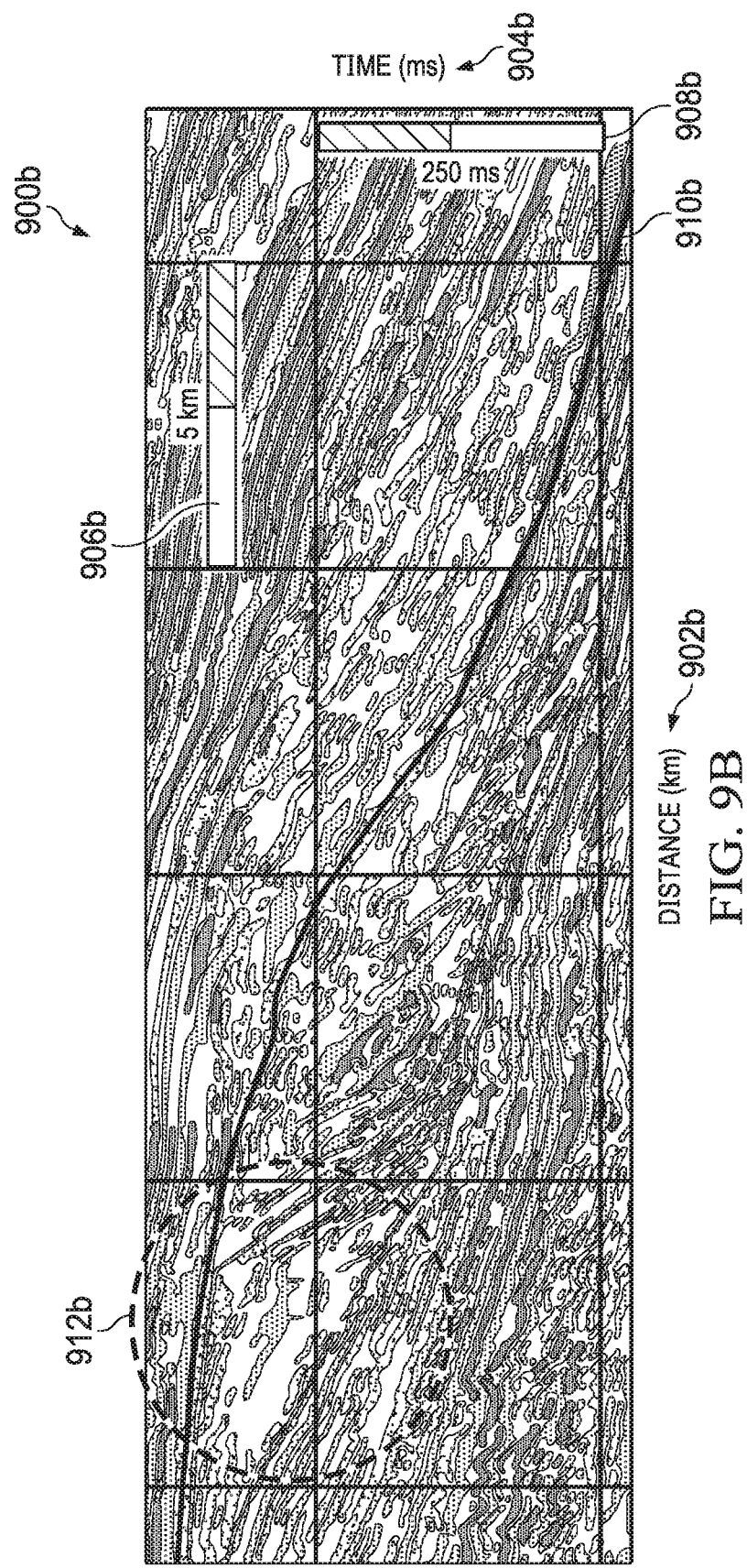
FIG. 9B is a data plot of an observed inline seismic profile, according to an implementation of the present disclosure.

FIG. 9B is a data plot 900b of an observed inline seismic profile, according to an implementation of the present disclosure. In FIG. 9B, the horizontal axis 902b represents Distance (km) and the vertical axis 904b represents Time (ms). Horizontal scale 906b and vertical scale 908b provide scale for the horizontal and vertical axes, respectively. The inline 910b is the Inline 425 (802c) of FIG. 8C. The target area for the simulation is indicated approximately at the center of dashed circle 912b.

Figure 9C:
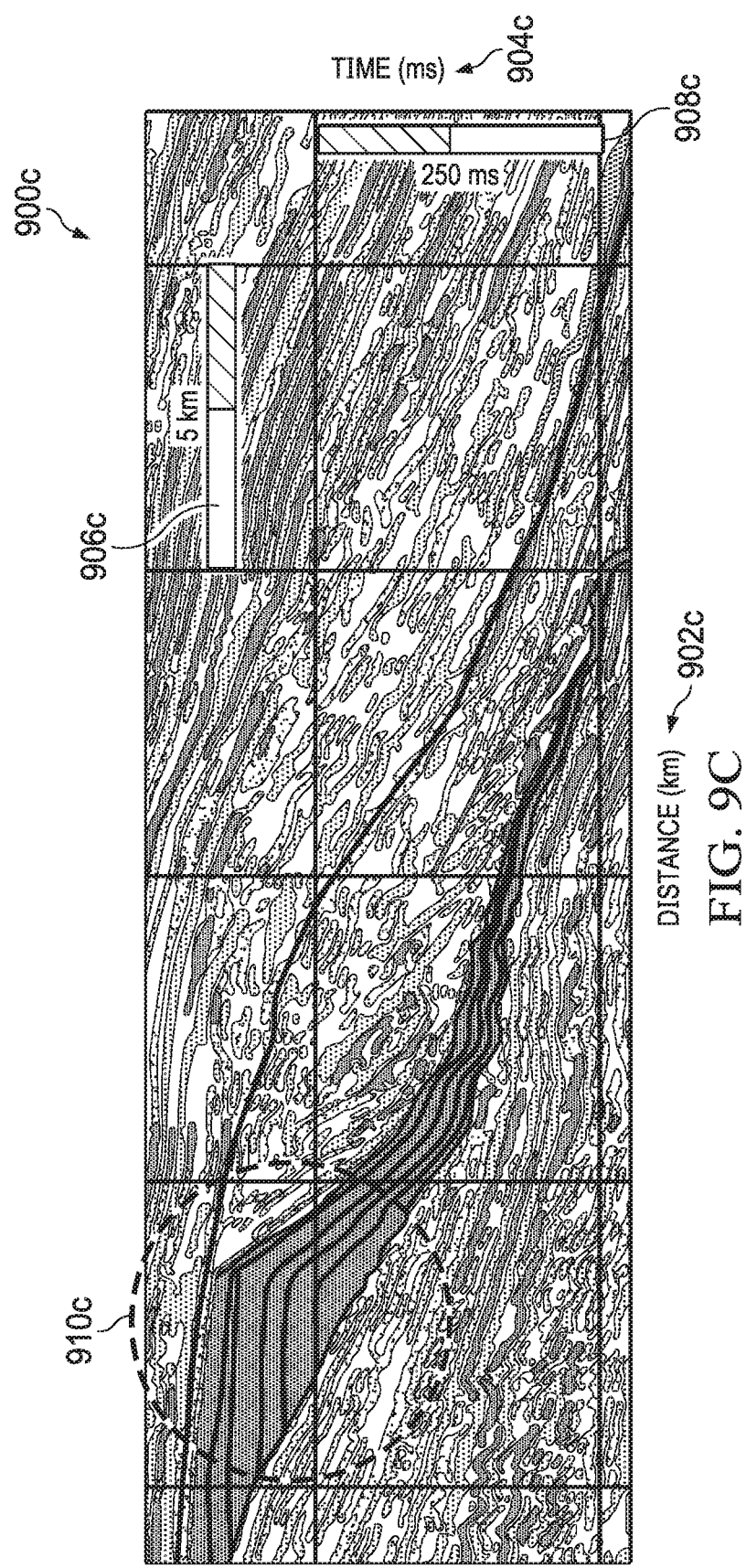
FIG. 9C is a data plot illustrating an overlap of observed inline profiled data and an inverse (simulation) result, according to an implementation of the present disclosure.

FIG. 9C is a data plot 900c illustrating an overlap of observed inline profiled data and an inverse (simulation) result, according to an implementation of the present disclosure. In FIG. 9C, the horizontal axis 902c represents Distance (km) and the vertical axis 904c represents Time (ms). Horizontal scale 906c and vertical scale 908c provide scale for the horizontal and vertical axes, respectively. Overlap (for example, at 910c) of the well-tuned inverse result on the observed seismic profile of FIG. 9B demonstrates that the inverse result is basically in accordance with the observed seismic profile of the deltaic deposit with about 90% accuracy.

Figure 10A:
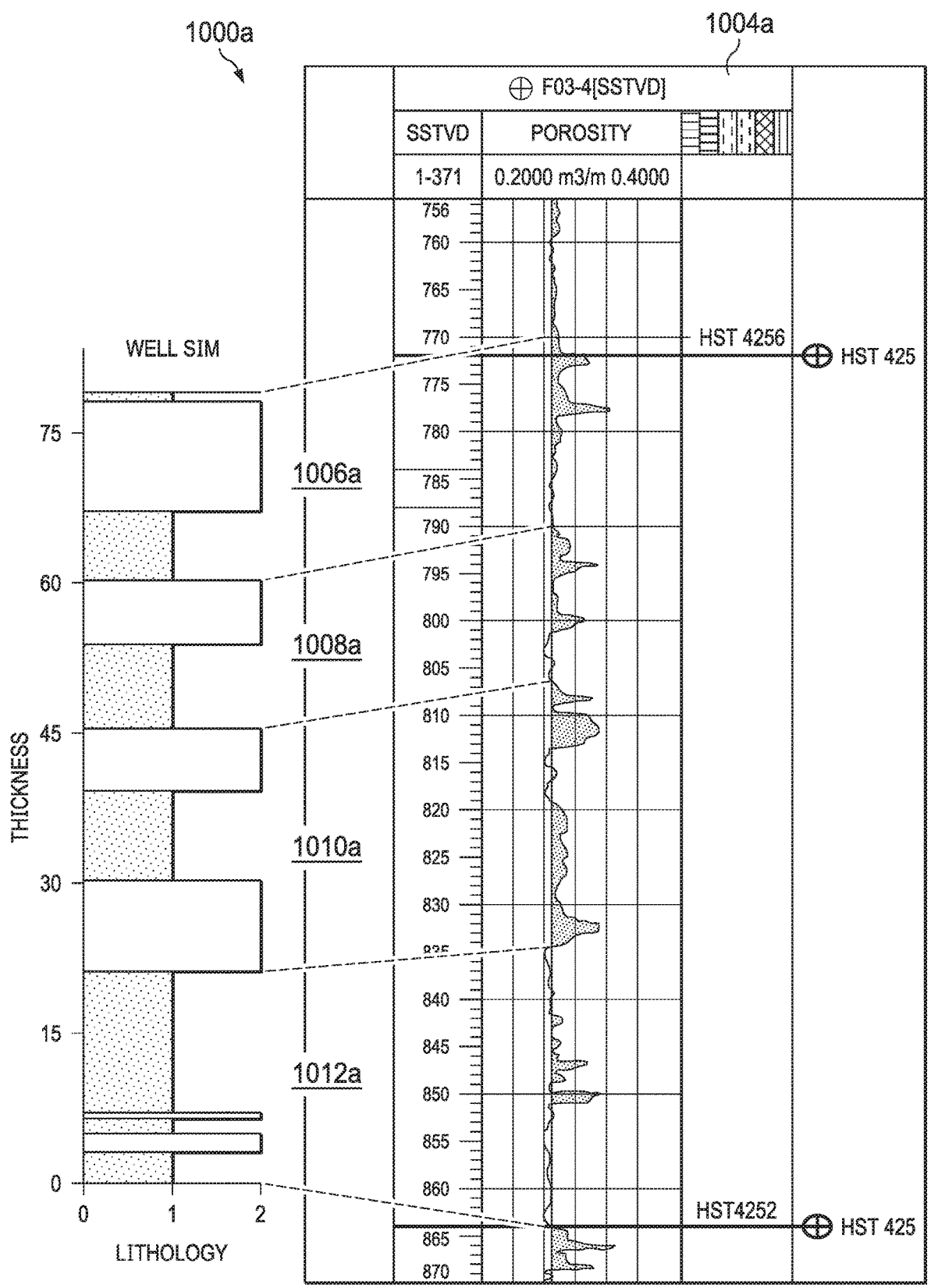
FIG. 10A is a graph of a comparison of simulated well data and well porosity log, according to an implementation of the present disclosure.

FIG. 10A is a graph 1000a of a comparison of simulated well data and well porosity log, according to an implementation of the present disclosure. Graph 1000a includes simulated well data 1002a in a left pane and the well porosity log 1004a of well F03-4 (FIG. 8C) in the right pane. The comparison of extracted well data from an inverse simulation result and the porosity log of well F03-4 shows that the simulation could generally reflect the variation trend of real data. For example, well F03-4 was divided into four sections 1006a, 1008a, 1010a, and 1012a. The top two sections (1006a and 1008a) mainly consist of one reverse cycle with about a 0.5 to 0.6 sand ratio. The third section (1010a) contains two sets of sand bodies and the lower sand bodies have larger thickness. The bottom section (1012a) is characterized by several fine sand layers (laminations) in mud. These features are well reproduced by simulation result, suggesting that the well calibrated forward model do have a good prediction for the real case.

Figure 10B:
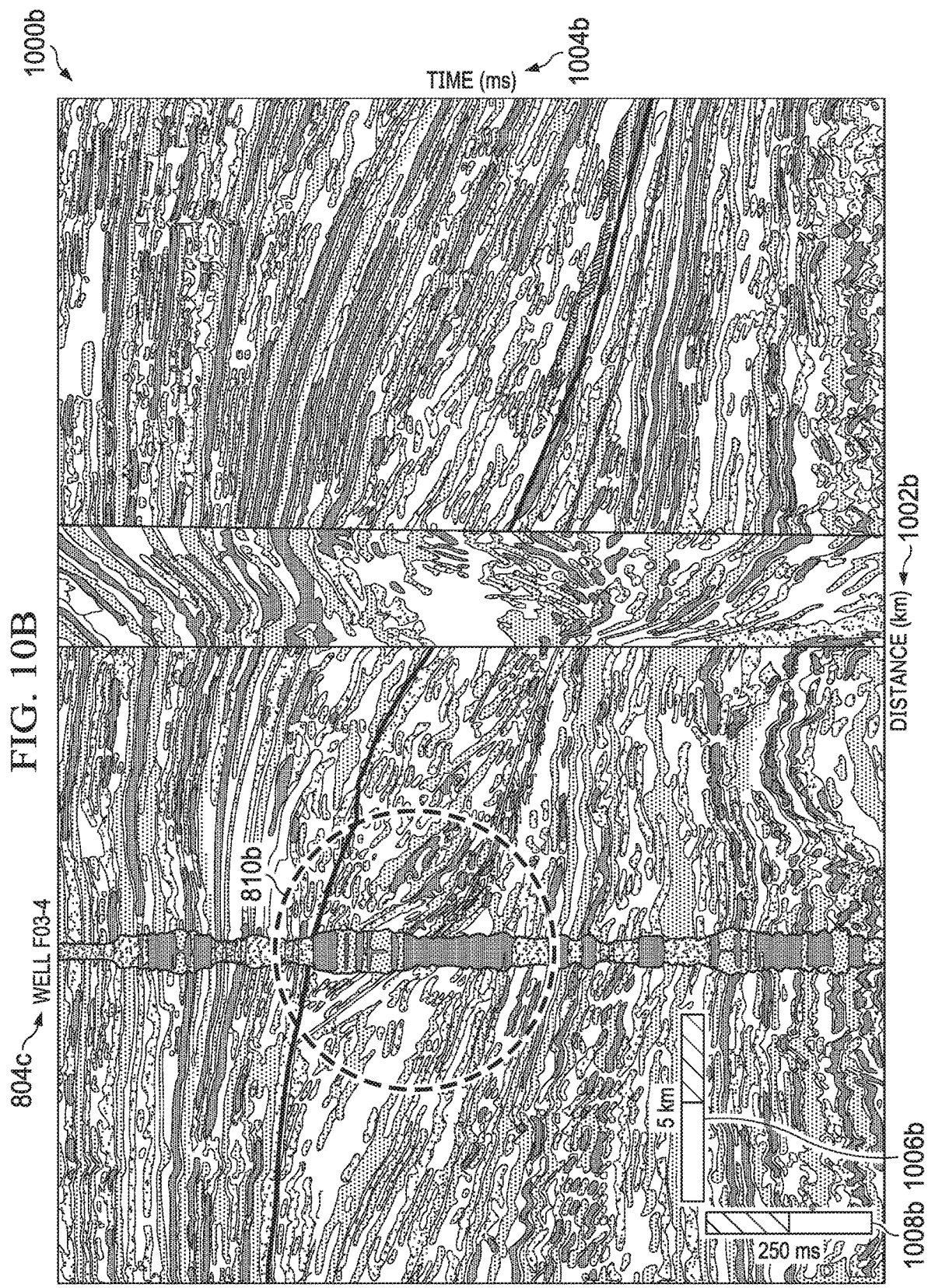
FIG. 10B is a data plot of a well penetrating a deltaic system, according to an implementation of the present disclosure.

FIG. 10B is a data plot 1000b of a well penetrating a deltaic system, according to an implementation of the present disclosure. In FIG. 10B, the horizontal axis 1002b represents Distance (km) and the vertical axis 1004b represents Time (ms). The well is Well F03-4 (804c of FIG. 8C) and the deltaic system is delta deposit 810b (as in FIG. 8B). The inverse result indicates a reasonable and quantitative geological interpretation of the sequence stratigraphic development and formation of the delta deposit 810b. Horizontal scale 1006b and vertical scale 1008b provide scale for the horizontal and vertical axes, respectively.

In some implementations, the described methodology can be configured to send messages, instructions, or other communications to a computer-implemented controller, database, or other computer-implemented system to dynamically initiate control of, control, or cause another computer-implemented system to perform a computer-implemented or other function/operation. For example, operations based on data, operations, outputs, or interaction with a graphical user interface (GUI) can be transmitted to cause operations associated with a computer, database, network, or other computer-based system to perform storage efficiency, data retrieval, or other operations consistent with this disclosure. In another example, interacting with any illustrated GUI can automatically result in one or more instructions transmitted from the GUI to trigger requests for data, storage of data, analysis of data, or other operations consistent with this disclosure.

In some instances, transmitted instructions can result in control, operation, modification, enhancement, or other operations with respect to a tangible, real-world piece of computing or other equipment. For example, the described GUIs can send a request to slow or speed up a computer database magnetic/optical disk drive, shut down/activate a computing system, cause a network interface device to disable, throttle, or increase data bandwidth allowed across a network connection, or sound an audible/visual alarm (for example, a mechanical alarm/light emitting device) as a notification of detected malicious behavior(s) with respect to a computing system(s) used with the described methodology or interacting with the computing system(s) used with the described methodology. In some implementation, the output of the described approach can be used to dynamically influence, direct, control, influence, or manage tangible equipment related to hydrocarbon production, analysis, and recovery. For example, real-time data received from an ongoing drilling operation can be analyzed using the described methodology. Depending on a result of the described methodology, a wellbore trajectory can be modified, a drill speed can be increased or reduced, a drill can be stopped, an alarm can be activated/deactivated (such as, visual, auditory, or voice alarms), refinery or pumping operations can be affected (for example, stopped, restarted, accelerated, or reduced). Other examples can include alerting geosteering and directional drilling staff when incorrect directional survey data has been detected (such as, with a visual, auditory, or voice alarm). In some implementations, the described approach can be integrated as part of a dynamic control system for any hydrocarbon-related equipment consistent with this disclosure.

Figure 11:
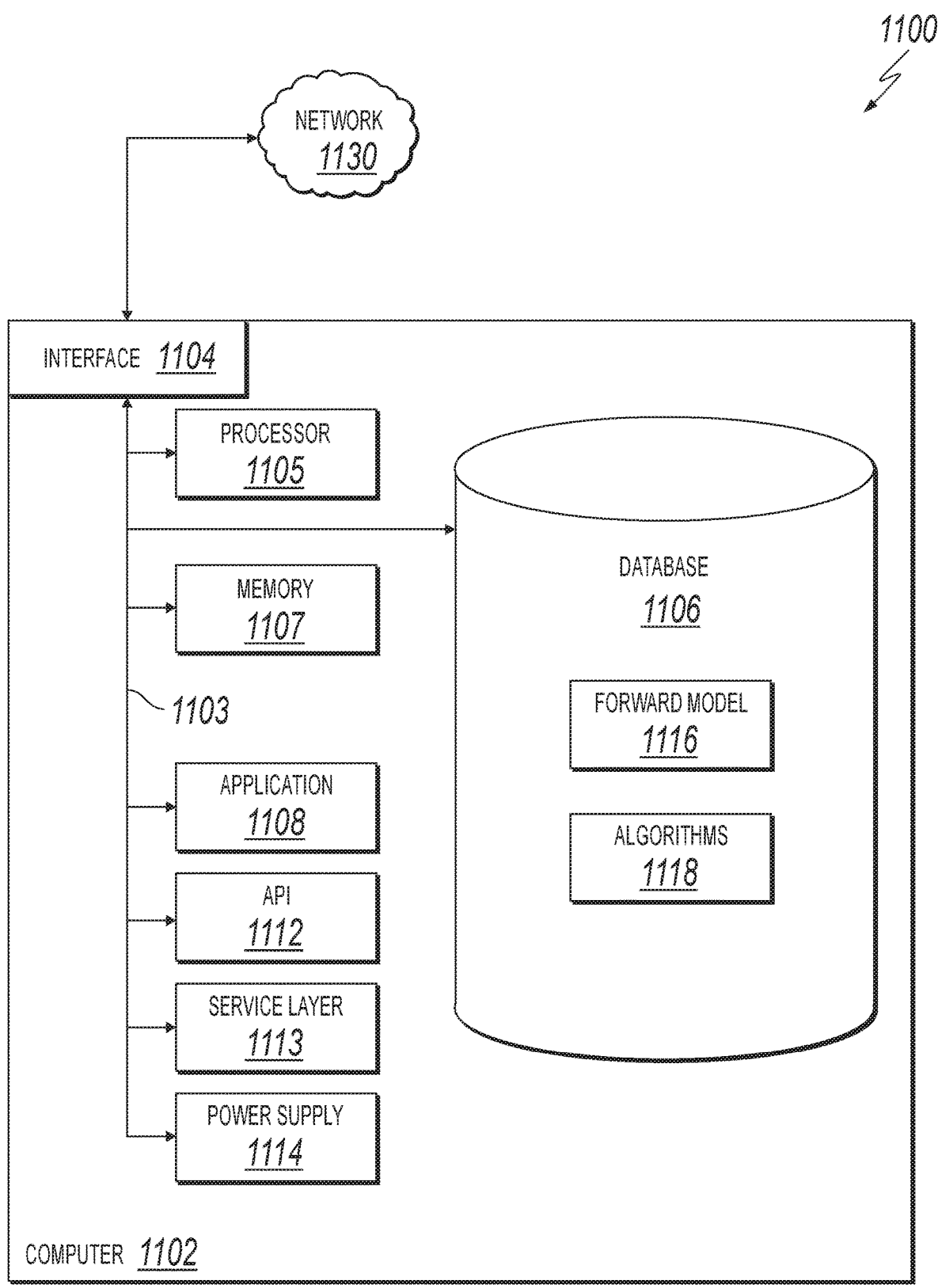
FIG. 11 is a block diagram illustrating an example of a computer-implemented system used to provide computational functionalities associated with described algorithms, methods, functions, processes, flows, and procedures, according to an implementation of the present disclosure.

FIG. 11 is a block diagram illustrating an example of a computer-implemented System 1100 used to provide computational functionalities associated with described algorithms, methods, functions, processes, flows, and procedures, according to an implementation of the present disclosure. In the illustrated implementation, System 1100 includes a Computer 1102 and a Network 1130.

The illustrated Computer 1102 is intended to encompass any computing device such as a server, desktop computer, laptop/notebook computer, wireless data port, smart phone, personal data assistant (PDA), tablet computer, one or more processors within these devices, another computing device, or a combination of computing devices, including physical or virtual instances of the computing device, or a combination of physical or virtual instances of the computing device. Additionally, the Computer 1102 can include an input device, such as a keypad, keyboard, touch screen, another input device, or a combination of input devices that can accept user information, and an output device that conveys information associated with the operation of the Computer 1102, including digital data, visual, audio, another type of information, or a combination of types of information, on a graphical-type user interface (UI) (or GUI) or other UI.

The Computer 1102 can serve in a role in a distributed computing system as a client, network component, a server, a database or another persistency, another role, or a combination of roles for performing the subject matter described in the present disclosure. The illustrated Computer 1102 is communicably coupled with a Network 1130. In some implementations, one or more components of the Computer 1102 can be configured to operate within an environment, including cloud-computing-based, local, global, another environment, or a combination of environments.

At a high level, the Computer 1102 is an electronic computing device operable to receive, transmit, process, store, or manage data and information associated with the described subject matter. According to some implementations, the Computer 1102 can also include or be communicably coupled with a server, including an application server, e-mail server, web server, caching server, streaming data server, another server, or a combination of servers.

The Computer 1102 can receive requests over Network 1130 (for example, from a client software application executing on another Computer 1102) and respond to the received requests by processing the received requests using a software application or a combination of software applications. In addition, requests can also be sent to the Computer 1102 from internal users (for example, from a command console or by another internal access method), external or third-parties, or other entities, individuals, systems, or computers.

Each of the components of the Computer 1102 can communicate using a System Bus 1103. In some implementations, any or all of the components of the Computer 1102, including hardware, software, or a combination of hardware and software, can interface over the System Bus 1103 using an application programming interface (API) 1112, a Service Layer 1113, or a combination of the API 1112 and Service Layer 1113. The API 1112 can include specifications for routines, data structures, and object classes. The API 1112 can be either computer-language independent or dependent and refer to a complete interface, a single function, or even a set of APIs. The Service Layer 1113 provides software services to the Computer 1102 or other components (whether illustrated or not) that are communicably coupled to the Computer 1102. The functionality of the Computer 1102 can be accessible for all service consumers using the Service Layer 1113. Software services, such as those provided by the Service Layer 1113, provide reusable, defined functionalities through a defined interface. For example, the interface can be software written in JAVA, C++, another computing language, or a combination of computing languages providing data in extensible markup language (XML) format, another format, or a combination of formats. While illustrated as an integrated component of the Computer 1102, alternative implementations can illustrate the API 1112 or the Service Layer 1113 as stand-alone components in relation to other components of the Computer 1102 or other components (whether illustrated or not) that are communicably coupled to the Computer 1102. Moreover, any or all parts of the API 1112 or the Service Layer 1113 can be implemented as a child or a sub-module of another software module, enterprise application, or hardware module without departing from the scope of the present disclosure.

The Computer 1102 includes an Interface 1104. Although illustrated as a single Interface 1104, two or more Interfaces 1104 can be used according to particular needs, desires, or particular implementations of the Computer 1102. The Interface 1104 is used by the Computer 1102 for communicating with another computing system (whether illustrated or not) that is communicatively linked to the Network 1130 in a distributed environment. Generally, the Interface 1104 is operable to communicate with the Network 1130 and includes logic encoded in software, hardware, or a combination of software and hardware. More specifically, the Interface 1104 can include software supporting one or more communication protocols associated with communications such that the Network 1130 or hardware of Interface 1104 is operable to communicate physical signals within and outside of the illustrated Computer 1102.

The Computer 1102 includes a Processor 1105. Although illustrated as a single Processor 1105, two or more Processors 1105 can be used according to particular needs, desires, or particular implementations of the Computer 1102. Generally, the Processor 1105 executes instructions and manipulates data to perform the operations of the Computer 1102 and any algorithms, methods, functions, processes, flows, and procedures as described in the present disclosure.

The Computer 1102 also includes a Database 1106 that can hold data for the Computer 1102, another component communicatively linked to the Network 1130 (whether illustrated or not), or a combination of the Computer 1102 and another component. For example, Database 1106 can be an in-memory, conventional, or another type of database storing data consistent with the present disclosure. In some implementations, Database 1106 can be a combination of two or more different database types (for example, a hybrid in-memory and conventional database) according to particular needs, desires, or particular implementations of the Computer 1102 and the described functionality. Although illustrated as a single Database 1106, two or more databases of similar or differing types can be used according to particular needs, desires, or particular implementations of the Computer 1102 and the described functionality. While Database 1106 is illustrated as an integral component of the Computer 1102, in alternative implementations, Database 1106 can be external to the Computer 1102. As illustrated, the Database 1106 holds a forward model 1116 and algorithms 1118 (for example, PSO, ALM, and GA).

The Computer 1102 also includes a Memory 1107 that can hold data for the Computer 1102, another component or components communicatively linked to the Network 1130 (whether illustrated or not), or a combination of the Computer 1102 and another component. Memory 1107 can store any data consistent with the present disclosure. In some implementations, Memory 1107 can be a combination of two or more different types of memory (for example, a combination of semiconductor and magnetic storage) according to particular needs, desires, or particular implementations of the Computer 1102 and the described functionality. Although illustrated as a single Memory 1107, two or more Memories 1107 or similar or differing types can be used according to particular needs, desires, or particular implementations of the Computer 1102 and the described functionality. While Memory 1107 is illustrated as an integral component of the Computer 1102, in alternative implementations, Memory 1107 can be external to the Computer 1102.

The Application 1108 is an algorithmic software engine providing functionality according to particular needs, desires, or particular implementations of the Computer 1102, particularly with respect to functionality described in the present disclosure. For example, Application 1108 can serve as one or more components, modules, or applications. Further, although illustrated as a single Application 1108, the Application 1108 can be implemented as multiple Applications 1108 on the Computer 1102. In addition, although illustrated as integral to the Computer 1102, in alternative implementations, the Application 1108 can be external to the Computer 1102.

The Computer 1102 can also include a Power Supply 1114. The Power Supply 1114 can include a rechargeable or non-rechargeable battery that can be configured to be either user- or non-user-replaceable. In some implementations, the Power Supply 1114 can include power-conversion or management circuits (including recharging, standby, or another power management functionality). In some implementations, the Power Supply 1114 can include a power plug to allow the Computer 1102 to be plugged into a wall socket or another power source to, for example, power the Computer 1102 or recharge a rechargeable battery.

There can be any number of Computers 1102 associated with, or external to, a computer system containing Computer 1102, each Computer 1102 communicating over Network 1130. Further, the term "client," "user," or other appropriate terminology can be used interchangeably, as appropriate, without departing from the scope of the present disclosure. Moreover, the present disclosure contemplates that many users can use one Computer 1102, or that one user can use multiple computers 1102.

Described implementations of the subject matter can include one or more features, alone or in combination.

For example, in a first implementation, a computer-implemented method for inverse stratigraphic modeling, comprising: a first step, further comprising: selecting a defined scope value for each of a plurality of hydrodynamic input parameters using a global optimization algorithm; generating a simulated topographical result using the selected scope values and a forward model; generating a detailed seismic interpretation to represent specific seismic features or observed topography; minimizing a calculated a misfit value, wherein the misfit value is calculated as a distance between the simulated topographical result and the detailed seismic interpretation; and; and generating an estimated optimized sand ratio and optimized hydrodynamic input parameters; and a second step, further comprising: determining, using a genetic algorithm, a proportion of each grain size in the estimated optimized sand ratio; using a misfit value calculated from thickness and porosity data extracted from well data and a simulation result generated by the forward model to generate optimized components of different grain sizes; and generating optimized hydrodynamic input parameters and optimized components of different grain sizes.

The foregoing and other described implementations can each, optionally, include one or more of the following features:

A first feature, combinable with any of the following features, wherein the global optimization algorithm is configured to randomly select a value from each of the defined scopes.

A second feature, combinable with any of the previous or following features, wherein the minimization of the calculated misfit value is optimized using a linear optimization algorithm.

A third feature, combinable with any of the previous or following features, wherein the estimated optimized sand ratio is used as a fixed parameter to optimize components of different grain sizes within the estimated optimized sand ratio.

A fourth feature, combinable with any of the previous or following features, wherein the distribution scope of components of different grain size is constrained by the estimated optimized sand ratio.

A fifth feature, combinable with any of the previous or following features, wherein generating the estimated optimized sand ratio and optimized hydrodynamic input parameters and generating optimized hydrodynamic input parameters and optimized components of different grain sizes are performed by iterating, respectively, across operations of the first step and operations of the second step.

A sixth feature, combinable with any of the previous or following features, further comprising performing forward modeling using the generated optimized hydrodynamic input parameters and optimized components of different grain sizes.

In a second implementation, a non-transitory, computer-readable medium storing one or more instructions executable by a computer system to perform operations comprising: a first step, further comprising: selecting a defined scope value for each of a plurality of hydrodynamic input parameters using a global optimization algorithm; generating a simulated topographical result using the selected scope values and a forward model; generating a detailed seismic interpretation to represent specific seismic features or observed topography; minimizing a calculated a misfit value, wherein the misfit value is calculated as a distance between the simulated topographical result and the detailed seismic interpretation; and generating an estimated optimized sand ratio and optimized hydrodynamic input parameters; and a second step, further comprising: determining, using a genetic algorithm, a proportion of each grain size in the estimated optimized sand ratio; using a misfit value calculated from thickness and porosity data extracted from well data and a simulation result generated by the forward model to generate optimized components of different grain sizes; and generating optimized hydrodynamic input parameters and optimized components of different grain sizes.

The foregoing and other described implementations can each, optionally, include one or more of the following features:

A first feature, combinable with any of the following features, wherein the global optimization algorithm is configured to randomly select a value from each of the defined scopes.

A second feature, combinable with any of the previous or following features, wherein the minimization of the calculated misfit value is optimized using a linear optimization algorithm.

A third feature, combinable with any of the previous or following features, wherein the estimated optimized sand ratio is used as a fixed parameter to optimize components of different grain sizes within the estimated optimized sand ratio.

A fourth feature, combinable with any of the previous or following features, wherein the distribution scope of components of different grain size is constrained by the estimated optimized sand ratio.

A fifth feature, combinable with any of the previous or following features, wherein generating the estimated optimized sand ratio and optimized hydrodynamic input parameters and generating optimized hydrodynamic input parameters and optimized components of different grain sizes are performed by iterating, respectively, across operations of the first step and operations of the second step.

A sixth feature, combinable with any of the previous or following features, further comprising performing forward modeling using the generated optimized hydrodynamic input parameters and optimized components of different grain sizes.

In a third implementation, a computer-implemented system, comprising: one or more computers; and one or more computer memory devices interoperably coupled with the one or more computers and having tangible, non-transitory, machine-readable media storing one or more instructions that, when executed by the one or more computers, perform one or more operations comprising: a first step, further comprising: selecting a defined scope value for each of a plurality of hydrodynamic input parameters using a global optimization algorithm; generating a simulated topographical result using the selected scope values and a forward model; generating a detailed seismic interpretation to represent specific seismic features or observed topography; minimizing a calculated a misfit value, wherein the misfit value is calculated as a distance between the simulated topographical result and the detailed seismic interpretation; and generating an estimated optimized sand ratio and optimized hydrodynamic input parameters; and a second step, further comprising: determining, using a genetic algorithm, a proportion of each grain size in the estimated optimized sand ratio; using a misfit value calculated from thickness and porosity data extracted from well data and a simulation result generated by the forward model to generate optimized components of different grain sizes; and generating optimized hydrodynamic input parameters and optimized components of different grain sizes.

The foregoing and other described implementations can each, optionally, include one or more of the following features:

A first feature, combinable with any of the following features, wherein the global optimization algorithm is configured to randomly select a value from each of the defined scopes.

A second feature, combinable with any of the previous or following features, wherein the minimization of the calculated misfit value is optimized using a linear optimization algorithm.

A third feature, combinable with any of the previous or following features, wherein the estimated optimized sand ratio is used as a fixed parameter to optimize components of different grain sizes within the estimated optimized sand ratio.

A fourth feature, combinable with any of the previous or following features, wherein the distribution scope of components of different grain size is constrained by the estimated optimized sand ratio.

A fifth feature, combinable with any of the previous or following features, wherein generating the estimated optimized sand ratio and optimized hydrodynamic input parameters and generating optimized hydrodynamic input parameters and optimized components of different grain sizes are performed by iterating, respectively, across operations of the first step and operations of the second step.

A sixth feature, combinable with any of the previous or following features, further comprising performing forward modeling using the generated optimized hydrodynamic input parameters and optimized components of different grain sizes.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs, that is, one or more modules of computer program instructions encoded on a tangible, non-transitory, computer-readable medium for execution by, or to control the operation of, a computer or computer-implemented system. Alternatively, or additionally, the program instructions can be encoded in/on an artificially generated propagated signal, for example, a machine-generated electrical, optical, or electromagnetic signal that is generated to encode information for transmission to a receiver apparatus for execution by a computer or computer-implemented system. The computer-storage medium can be a machine-readable storage device, a machine-readable storage substrate, a random or serial access memory device, or a combination of computer-storage mediums. Configuring one or more computers means that the one or more computers have installed hardware, firmware, or software (or combinations of hardware, firmware, and software) so that when the software is executed by the one or more computers, particular computing operations are performed.

The term "real-time," "real time," "realtime," "real (fast) time (RFT)," "near(ly) real-time (NRT)," "quasi real-time," or similar terms (as understood by one of ordinary skill in the art), means that an action and a response are temporally proximate such that an individual perceives the action and the response occurring substantially simultaneously. For example, the time difference for a response to display (or for an initiation of a display) of data following the individual's action to access the data can be less than 1 ms, less than 1 second (s), or less than 5 s. While the requested data need not be displayed (or initiated for display) instantaneously, it is displayed (or initiated for display) without any intentional delay, taking into account processing limitations of a described computing system and time required to, for example, gather, accurately measure, analyze, process, store, or transmit the data.

The terms "data processing apparatus," "computer," or "electronic computer device" (or an equivalent term as understood by one of ordinary skill in the art) refer to data processing hardware. Data processing hardware encompass all kinds of apparatuses, devices, and machines for processing data, including by way of example, a programmable processor, a computer, or multiple processors or computers. The computer can also be, or further include special purpose logic circuitry, for example, a central processing unit (CPU), an FPGA (field programmable gate array), or an ASIC (application-specific integrated circuit). In some implementations, the computer or computer-implemented system or special purpose logic circuitry (or a combination of the computer or computer-implemented system and special purpose logic circuitry) can be hardware- or software-based (or a combination of both hardware- and software-based). The computer can optionally include code that creates an execution environment for computer programs, for example, code that constitutes processor firmware, a protocol stack, a database management system, an operating system, or a combination of execution environments. The present disclosure contemplates the use of a computer or computer-implemented system with an operating system of some type, for example LINUX, UNIX, WINDOWS, MAC OS, ANDROID, IOS, another operating system, or a combination of operating systems.

A computer program, which can also be referred to or described as a program, software, a software application, a unit, a module, a software module, a script, code, or other component can be written in any form of programming language, including compiled or interpreted languages, or declarative or procedural languages, and it can be deployed in any form, including, for example, as a stand-alone program, module, component, or subroutine, for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network.

While portions of the programs illustrated in the various figures can be illustrated as individual components, such as units or modules, that implement described features and functionality using various objects, methods, or other processes, the programs can instead include a number of sub-units, sub-modules, third-party services, components, libraries, and other components, as appropriate. Conversely, the features and functionality of various components can be combined into single components, as appropriate. Thresholds used to make computational determinations can be statically, dynamically, or both statically and dynamically determined.

Described methods, processes, or logic flows represent one or more examples of functionality consistent with the present disclosure and are not intended to limit the disclosure to the described or illustrated implementations, but to be accorded the widest scope consistent with described principles and features. The described methods, processes, or logic flows can be performed by one or more programmable computers executing one or more computer programs to perform functions by operating on input data and generating output data. The methods, processes, or logic flows can also be performed by, and computers can also be implemented as, special purpose logic circuitry, for example, a CPU, an FPGA, or an ASIC.

Computers for the execution of a computer program can be based on general or special purpose microprocessors, both, or another type of CPU. Generally, a CPU will receive instructions and data from and write to a memory. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable memory storage device.

Non-transitory computer-readable media for storing computer program instructions and data can include all forms of permanent/non-permanent or volatile/non-volatile memory, media and memory devices, including by way of example semiconductor memory devices, for example, random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices; magnetic devices, for example, tape, cartridges, cassettes, internal/removable disks; magneto-optical disks; and optical memory devices, for example, digital versatile/video disc (DVD), compact disc (CD)-ROM, DVD+/−R, DVD-RAM, DVD-ROM, high-definition/density (HD)-DVD, and BLU-RAY/BLU-RAY DISC (BD), and other optical memory technologies. The memory can store various objects or data, including caches, classes, frameworks, applications, modules, backup data, jobs, web pages, web page templates, data structures, database tables, repositories storing dynamic information, or other appropriate information including any parameters, variables, algorithms, instructions, rules, constraints, or references. Additionally, the memory can include other appropriate data, such as logs, policies, security or access data, or reporting files. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input can also be provided to the computer using a touchscreen, such as a tablet computer surface with pressure sensitivity, a multi-touch screen using capacitive or electric sensing, or another type of touchscreen. Other types of devices can be used to interact with the user. For example, feedback provided to the user can be any form of sensory feedback (such as, visual, auditory, tactile, or a combination of feedback types). Input from the user can be received in any form, including acoustic, speech, or tactile input. In addition, a computer can interact with the user by sending documents to and receiving documents from a client computing device that is used by the user (for example, by sending web pages to a web browser on a user's mobile computing device in response to requests received from the web browser).

The term "graphical user interface," or "GUI," can be used in the singular or the plural to describe one or more graphical user interfaces and each of the displays of a particular graphical user interface. Therefore, a GUI can represent any graphical user interface, including but not limited to, a web browser, a touch screen, or a command line interface (CLI) that processes information and efficiently presents the information results to the user. In general, a GUI can include a number of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20 (or a combination of 802.11x and 802.20 or other protocols consistent with the present disclosure), all or a portion of the Internet, another communication network, or a combination of communication networks. The communication network can communicate with, for example, Internet Protocol (IP) packets, Frame Relay frames, Asynchronous Transfer Mode (ATM) cells, voice, video, data, or other information between network nodes.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any inventive concept or on the scope of what can be claimed, but rather as descriptions of features that can be specific to particular implementations of particular inventive concepts. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features can be described as acting in certain combinations and even initially claimed as such, one or more features from a claimed combination can, in some cases, be excised from the combination, and the claimed combination can be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations can be considered optional), to achieve desirable results. In certain circumstances, multitasking or parallel processing (or a combination of multitasking and parallel processing) can be advantageous and performed as deemed appropriate.

Moreover, the separation or integration of various system modules and components in the previously described implementations should not be understood as requiring such separation or integration in all implementations, and it should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions stored on the non-transitory, computer-readable medium.

What is claimed is:

1. A computer-implemented method for inverse stratigraphic modeling, comprising:
a first step, further comprising:
selecting a defined scope value for each of a plurality of hydrodynamic input parameters using a global optimization algorithm;
generating a simulated topographical result using the selected scope values and a forward model;
generating a detailed seismic interpretation to represent specific seismic features or observed topography;
minimizing a calculated a misfit value, wherein the misfit value is calculated as a distance between the simulated topographical result and the detailed seismic interpretation; and
generating an estimated optimized sand ratio and optimized hydrodynamic input parameters; and
a second step, further comprising:
determining, using a genetic algorithm, a proportion of each grain size in the estimated optimized sand ratio;
using a misfit value calculated from thickness and porosity data extracted from well data and a simulation result generated by the forward model to generate optimized components of different grain sizes; and
generating optimized hydrodynamic input parameters and optimized components of different grain sizes.

2. The computer-implemented method of claim 1, wherein the global optimization algorithm is configured to randomly select a value from each of the defined scopes.

3. The computer-implemented method of claim 1, wherein the minimization of the calculated misfit value is optimized using a linear optimization algorithm.

4. The computer-implemented method of claim 1, wherein the estimated optimized sand ratio is used as a fixed parameter to optimize components of different grain sizes within the estimated optimized sand ratio.

5. The computer-implemented method of claim 4, wherein the distribution scope of components of different grain size is constrained by the estimated optimized sand ratio.

6. The computer-implemented method of claim 1, wherein generating the estimated optimized sand ratio and optimized hydrodynamic input parameters and generating optimized hydrodynamic input parameters and optimized components of different grain sizes are performed by iterating, respectively, across operations of the first step and operations of the second step.

7. The computer-implemented method of claim 1, further comprising performing forward modeling using the generated optimized hydrodynamic input parameters and optimized components of different grain sizes.

8. A non-transitory, computer-readable medium storing one or more instructions that, when executed by a computer system, perform operations comprising:
a first step, further comprising:
selecting a defined scope value for each of a plurality of hydrodynamic input parameters using a global optimization algorithm;
generating a simulated topographical result using the selected scope values and a forward model;
generating a detailed seismic interpretation to represent specific seismic features or observed topography;
minimizing a calculated a misfit value, wherein the misfit value is calculated as a distance between the simulated topographical result and the detailed seismic interpretation; and
generating an estimated optimized sand ratio and optimized hydrodynamic input parameters; and
a second step, further comprising:
determining, using a genetic algorithm, a proportion of each grain size in the estimated optimized sand ratio;
using a misfit value calculated from thickness and porosity data extracted from well data and a simulation result generated by the forward model to generate optimized components of different grain sizes; and
generating optimized hydrodynamic input parameters and optimized components of different grain sizes.

9. The non-transitory, computer-readable medium of claim 8, wherein the global optimization algorithm is configured to randomly select a value from each of the defined scopes.

10. The non-transitory, computer-readable medium of claim 8, wherein the minimization of the calculated misfit value is optimized using a linear optimization algorithm.

11. The non-transitory, computer-readable medium of claim 8, wherein the estimated optimized sand ratio is used as a fixed parameter to optimize components of different grain sizes within the estimated optimized sand ratio.

12. The non-transitory, computer-readable medium of claim 11, wherein the distribution scope of components of different grain size is constrained by the estimated optimized sand ratio.

13. The non-transitory, computer-readable medium of claim 8, wherein generating the estimated optimized sand ratio and optimized hydrodynamic input parameters and generating optimized hydrodynamic input parameters and optimized components of different grain sizes are performed by iterating, respectively, across operations of the first step and operations of the second step.

14. The non-transitory, computer-readable medium of claim 8, further comprising performing forward modeling using the generated optimized hydrodynamic input parameters and optimized components of different grain sizes.

15. A computer-implemented system, comprising:
one or more computers; and
one or more computer memory devices interoperably coupled with the one or more computers and having tangible, non-transitory, machine-readable media storing one or more instructions that, when executed by the one or more computers, perform one or more operations comprising:
a first step, further comprising:
selecting a defined scope value for each of a plurality of hydrodynamic input parameters using a global optimization algorithm;
generating a simulated topographical result using the selected scope values and a forward model;
generating a detailed seismic interpretation to represent specific seismic features or observed topography;
minimizing a calculated a misfit value, wherein the misfit value is calculated as a distance between the simulated topographical result and the detailed seismic interpretation; and
generating an estimated optimized sand ratio and optimized hydrodynamic input parameters; and
a second step, further comprising:
determining, using a genetic algorithm, a proportion of each grain size in the estimated optimized sand ratio;
using a misfit value calculated from thickness and porosity data extracted from well data and a simulation result generated by the forward model to generate optimized components of different grain sizes; and generating optimized hydrodynamic input parameters and optimized components of different grain sizes.

16. The computer-implemented system of claim 15, wherein the global optimization algorithm is configured to randomly select a value from each of the defined scopes.

17. The computer-implemented system of claim 15, wherein the minimization of the calculated misfit value is optimized using a linear optimization algorithm.

18. The computer-implemented system of claim 15, wherein the estimated optimized sand ratio is used as a fixed parameter to optimize components of different grain sizes within the estimated optimized sand ratio, and wherein the distribution scope of components of different grain size is constrained by the estimated optimized sand ratio.

19. The computer-implemented system of claim 15, wherein generating the estimated optimized sand ratio and optimized hydrodynamic input parameters and generating optimized hydrodynamic input parameters and optimized components of different grain sizes are performed by iterating, respectively, across operations of the first step and operations of the second step.

20. The computer-implemented system of claim 15, further comprising performing forward modeling using the generated optimized hydrodynamic input parameters and optimized components of different grain sizes.

\* \* \* \* \*